(12) United States Patent  
Minowa et al.

(10) Patent No.: US 10,033,953 B2  
(45) Date of Patent: Jul. 24, 2018

(54) SOLID STATE IMAGING DEVICE AND IMAGING SYSTEM WHICH REDUCES NOISE CAUSED BY MAGNETIC FIELD FLUCTUATION

(71) Applicant: CANON KABUSHIKI KAISHA, Tokyo (JP)

(72) Inventors: Masaaki Minowa, Kawasaki (JP); Keisuke Ota, Tokyo (JP); Takahiro Yamasaki, Inzai (JP); Takamasa Sakuragi, Machida (JP); Noriyuki Kaifu, Atsugi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/258,805

(22) Filed: Sep. 7, 2016

(65) Prior Publication Data

US 2017/0099448 A1 Apr. 6, 2017

(30) Foreign Application Priority Data

Oct. 1, 2015 (JP) .................................. 2015-195719

(51) Int. Cl.
*H04N 5/378* (2011.01)
*H04N 5/374* (2011.01)
(Continued)

(52) U.S. Cl.
CPC ....... *H04N 5/378* (2013.01); *H01L 27/14614* (2013.01); *H01L 27/14638* (2013.01);
(Continued)

(58) Field of Classification Search
CPC ...... H04N 5/378; H04N 5/3577; H04N 5/374; H04N 5/3742; H01L 27/14614; H01L 27/14638; H01L 27/14643
See application file for complete search history.

(56) References Cited

U.S. PATENT DOCUMENTS 4,922,117 A 5/1990 Saika
4,939,592 A 7/1990 Saika
(Continued)

FOREIGN PATENT DOCUMENTS

JP 2012-10008 1/2012

OTHER PUBLICATIONS

U.S. Appl. No. 15/143,724, filed May 2, 2016.
(Continued)

*Primary Examiner* — Luong T Nguyen
(74) *Attorney, Agent, or Firm* — Fitzpatrick, Cella, Harper & Scinto

(57) ABSTRACT

Provided is a solid state imaging device including a plurality of pixels, a signal line on which a pixel signal is transmitted, a load transistor having a drain connected to the signal line, a readout circuit that reads out the pixel signal from the signal line, and a control unit that controls a current flowing in the load transistor in accordance with a potential of a control terminal. When a reference potential of the pixel fluctuates relatively to a reference potential of the readout circuit, a potential of the control terminal relative to a potential of a source of the load transistor is changed in a same phase with a fluctuation of the reference potential of the pixel.

17 Claims, 19 Drawing Sheets

(51) Int. Cl.
*H01L 27/146* (2006.01)
*H04N 5/357* (2011.01)

(52) U.S. Cl.
CPC ..... *H01L 27/14643* (2013.01); *H04N 5/3577* (2013.01); *H04N 5/374* (2013.01); *H04N 5/3742* (2013.01); *H01L 27/14612* (2013.01)

(56) References Cited

U.S. PATENT DOCUMENTS

| | | | |
|---|---|---|---|
| 6,271,880 B1 | 8/2001 | Kameshima | |
| 6,717,151 B2 | 4/2004 | Tashiro | |
| 6,798,453 B1 | 9/2004 | Kaifu | |
| 6,800,836 B2 | 10/2004 | Hamamoto | |
| 7,023,482 B2 | 4/2006 | Sakuragi | |
| 7,129,458 B2 | 10/2006 | Hamamoto | |
| 7,355,645 B2 * | 4/2008 | Sakurai | H04N 5/361 348/308 |
| 7,800,526 B2 * | 9/2010 | Nitta | H04N 5/335 341/155 |
| 7,859,575 B2 | 12/2010 | Ota | |
| 8,189,086 B2 | 5/2012 | Hashimoto | |
| 8,278,613 B2 | 10/2012 | Okita | |
| 8,310,576 B2 | 11/2012 | Hashimoto | |
| 8,553,119 B2 | 10/2013 | Hashimoto | |
| 8,599,295 B2 | 12/2013 | Matsumoto | |
| 8,624,992 B2 | 1/2014 | Ota | |
| 8,638,384 B2 | 1/2014 | Sakuragi | |
| 8,749,683 B2 | 6/2014 | Minowa | |
| 8,884,864 B2 | 11/2014 | Sakuragi | |
| 8,885,084 B2 * | 11/2014 | Egawa | H04N 5/355 348/300 |
| 8,922,668 B2 | 12/2014 | Ota | |
| 8,975,569 B2 * | 3/2015 | Yamazaki | H04N 5/378 250/208.1 |
| 9,232,164 B2 | 1/2016 | Minowa | |
| 9,300,884 B2 | 3/2016 | Minowa | |
| 2010/0321532 A1 | 12/2010 | Hashimoto | |
| 2011/0279720 A1 * | 11/2011 | Nakagawa | H04N 5/3745 348/300 |
| 2012/0043454 A1 | 2/2012 | Sakuragi | |
| 2015/0109504 A1 | 4/2015 | Sakuragi | |
| 2015/0109505 A1 | 4/2015 | Sakuragi | |
| 2015/0326812 A1 | 11/2015 | Sakuragi | |
| 2016/0014356 A1 | 1/2016 | Sakuragi | |
| 2016/0027825 A1 | 1/2016 | Moriyama | |
| 2016/0099268 A1 | 4/2016 | Minowa | |
| 2016/0133663 A1 | 5/2016 | Minowa | |
| 2016/0150176 A1 | 5/2016 | Hiyama | |
| 2016/0173797 A1 | 6/2016 | Minowa | |
| 2016/0182839 A1 | 6/2016 | Shigeta | |

OTHER PUBLICATIONS

U.S. Appl. No. 15/143,817, filed May 2, 2016.
U.S. Appl. No. 15/227,576, filed Aug. 3, 2016.
U.S. Appl. No. 15/217,526, filed Jul. 22, 2016.
U.S. Appl. No. 15/237,272, filed Aug. 15, 2016.

* cited by examiner

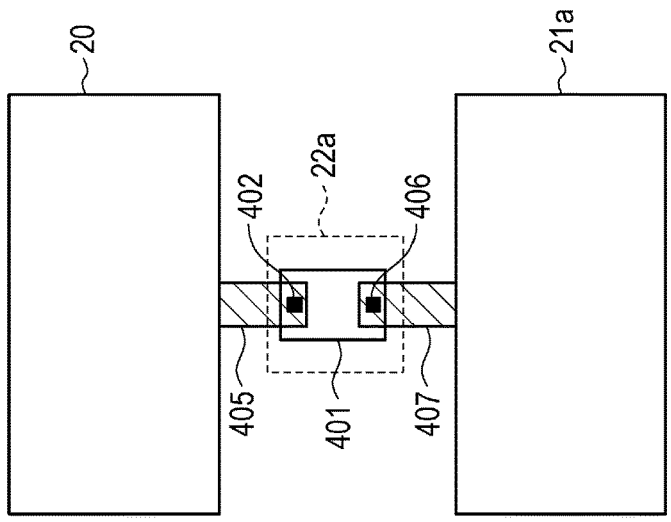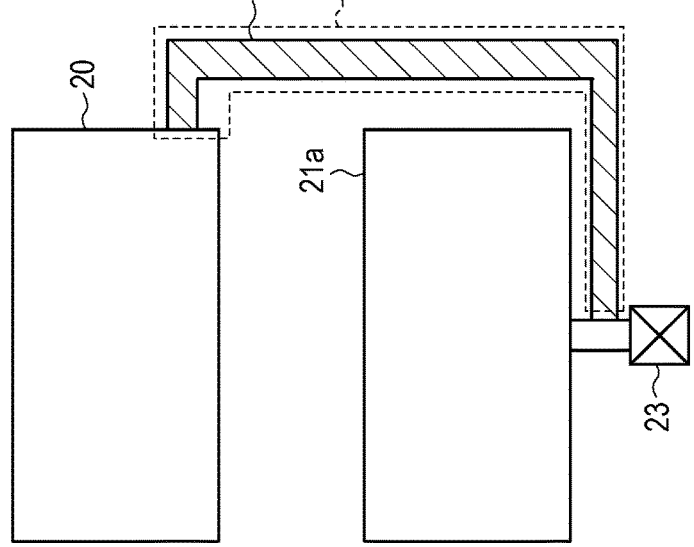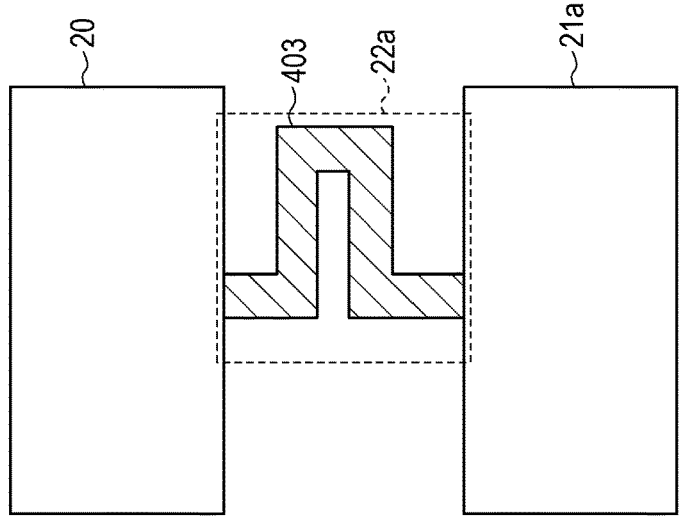

SOLID STATE IMAGING DEVICE AND IMAGING SYSTEM WHICH REDUCES NOISE CAUSED BY MAGNETIC FIELD FLUCTUATION

BACKGROUND OF THE INVENTION

Field of the Invention

The present invention relates to a solid state imaging device and an imaging system.

Description of the Related Art

Japanese Patent Application Laid-open No. 2012-010008 discloses a solid state imaging device that cancels noises due to a potential difference on ground wirings from a current source. The solid state imaging device of Japanese Patent Application Laid-open No. 2012-010008 has a holding capacitor that holds, at a predetermined potential, a gate potential of the current source connected to signal lines that read out signals from pixels.

In Japanese Patent Application Laid-open No. 2012-010008, however, a potential difference occurring on ground wirings in a pixel region is not taken into consideration. When a magnetic field around a solid state imaging device temporarily fluctuates and when ground wirings form a loop extending via the inside or the outside of the solid state imaging device, an induced electromotive force proportional to a temporal change amount of a magnetic flux penetrating the loop may occur on the ground wirings. Thus, a potential difference occurring on the ground wirings within the solid state imaging device including a pixel region may cause a noise. However, Japanese Patent Application Laid-open No. 2012-010008 neither discloses such a noise caused by a magnetic field fluctuation nor refers to any technology for reducing such noise.

SUMMARY OF THE INVENTION

According to one aspect of the present invention, provided is a solid state imaging device including a plurality of pixels arranged to form a plurality of columns and each configured to output a pixel signal; a signal line provided correspondingly to each of the plurality of columns, in which the pixel signal is transmitted via the signal line; a load transistor provided correspondingly to each of the plurality of columns and having a drain connected to the signal line; a readout circuit provided correspondingly to each of the plurality of columns and configured to read out the pixel signal from the signal line; and a control unit provided correspondingly to each of the plurality of columns and configured to control a current flowing in the load transistor in accordance with a potential of a control terminal of the control unit, in which, when a reference potential of one of the plurality of pixels fluctuates relatively to a reference potential of the corresponding readout circuit, a potential of the control terminal relative to a potential of a source of the corresponding load transistor is changed in a same phase with a fluctuation of the reference potential of the one of the plurality of pixels.

According to another aspect of the present invention, provided is a solid state imaging device including a semiconductor substrate including a first region, a second region, and a third region; a plurality of pixels arranged in the first region to form a plurality of columns and each configured to output a pixel signal; a signal line provided correspondingly to each of the plurality of columns, in which the pixel signal is transmitted via the signal line; a load transistor provided, in the second region, correspondingly to each of the plurality of columns and having a drain connected to the signal line; a readout circuit provided, in the third region, correspondingly to each of the plurality of columns and configured to read out the pixel signal from the signal line; a control unit provided correspondingly to each of the plurality of columns and configured to control a current flowing in the load transistor in accordance with a potential of a control terminal of the control unit; a first reference potential wiring configured to supply a reference potential to the plurality of pixels; and a second reference potential wiring configured to supply a reference potential to the readout circuit, in which the second region and the third region are arranged between the first region and one side of the semiconductor substrate, in which the first reference potential wiring and the second reference potential wiring are separated within a layer in which the first reference potential wiring and the second reference potential wiring are provided, in which a source of the load transistor is connected to the second reference potential wiring, and in which the control terminal of the control unit is connected to the first reference potential wiring.

According to another aspect of the present invention, provided is a solid state imaging device including a semiconductor substrate including a first region, a second region, and a third region; a plurality of pixels arranged in the first region to form a plurality of columns and each configured to output a pixel signal; a signal line provided correspondingly to each of the plurality of columns, in which the pixel signal is transmitted via the signal line; a load transistor provided, in the second region, correspondingly to each of the plurality of columns and having a drain connected to the signal line; a readout circuit provided, in the third region, correspondingly to each of the plurality of columns and configured to read out the pixel signal from the signal line; a control unit provided correspondingly to each of the plurality of columns and configured to control a current flowing in the load transistor in accordance with a potential of a control terminal of the control unit; a first reference potential wiring configured to supply a reference potential to the plurality of pixels; and a second reference potential wiring configured to supply a reference potential to the readout circuit, in which the first region is arranged between the second region and the third region, in which the first reference potential wiring and the second reference potential wiring are separated within a layer in which the first reference potential wiring and the second reference potential wiring are provided, in which a source of the load transistor is connected to the first reference potential wiring, and in which the control terminal of the control unit is connected to the second reference potential wiring.

Further features of the present invention will become apparent from the following description of exemplary embodiments with reference to the attached drawings.

BRIEF DESCRIPTION OF THE DRAWINGS

FIG. 4A, FIG. 4B, and FIG. 4C are plan views illustrating structure of a connection portion of the solid state imaging device according to the first embodiment.

DESCRIPTION OF THE EMBODIMENTS

Preferred embodiments of the present invention will now be described in detail in accordance with the accompanying drawings.

First Embodiment

Figure 1:
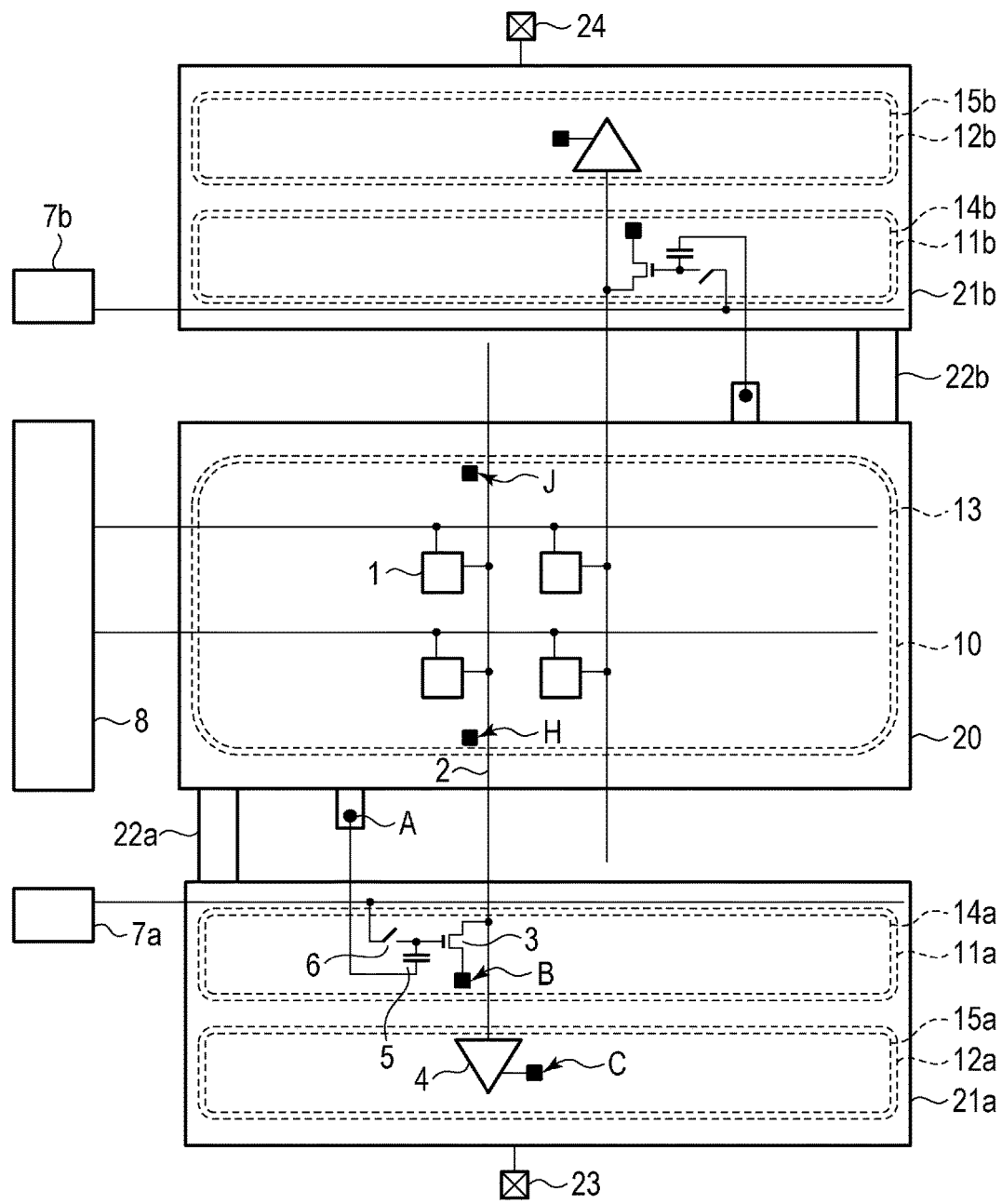
FIG. 1 is a diagram illustrating a configuration of a solid state imaging device according to a first embodiment.

FIG. 1 is a diagram illustrating a configuration of a solid state imaging device of the present embodiment. The solid state imaging device has a pixel region 10, regions 11a, 11b, 12a, and 12b, voltage generating circuits 7a and 7b, and a vertical scanning circuit 8, which are formed on a semiconductor substrate. In the pixel region (a first region), a pixel array is provided in which a plurality of pixels 1 are arranged to form a plurality of rows and a plurality of columns. Each of the pixels 1 includes a photoelectric conversion unit that generates charges in accordance with an amount of an incident light, and an amplification unit that outputs, as a pixel signal, a voltage that is based on charges generated by the photoelectric conversion unit. The plurality of pixels 1 are formed within a common well (a first well) 13. The common well 13 is included in the pixel region 10. In the pixel region 10, signal lines 2 formed on a column basis of the pixel array are arranged. The signal lines 2 for respective columns are connected to the plurality of pixels on corresponding columns and transmit pixel signals output from the pixels 1.

The region 11a (a second region) is provided in the side of one side of the pixel region 10. That is, the region 11a is provided between the pixel region 10 and the one side of the semiconductor substrate. The region 11b (a fourth region) is provided in the side of the other side that is opposite to the above-described one side, interposing the pixel region 10. The region 12a (a third region) is provided adjacent to the region 11a, and the region 12b (a fifth region) is provided adjacent to the region 11b. That is, the region 12a is provided between the pixel region 10 and the one side of the semiconductor substrate. A part of the plurality of signal lines 2 extends to the region 11a and region 12a from the plurality of pixels 1, the other part of the plurality of signal lines 2 extends to the region 11b and region 12b from the plurality of pixels 1. The voltage generating circuit 7a supplies a voltage to the region 11a via a voltage wiring. The voltage generating circuit 7b supplies a voltage to the region 11b via a voltage wiring. The regions 11a and 12a and the voltage generating circuit 7a provided in the side of one side of the pixel region 10 have the same configuration and function as the regions 11b and 12b and the voltage generating circuit 7b provided in the side of the other side. Therefore, in the following description of the present embodiment, the regions 11a and 12a and the voltage generating circuit 7a will be mainly discussed and description of the regions 11b and 12b and the voltage generating circuit 7b may be simplified or omitted.

The region 11a has a load transistor 3, a capacitor 5, and a switch 6 that are provided correspondingly to one of the signal lines 2. The region 12a has a readout circuit 4 that is provided correspondingly to the signal line 2. The region 11a includes a P-type well and an N-type well. FIG. 1 illustrates a P-type well as a well 14a. The load transistor 3 may be formed of an NMOS transistor formed in the well 14a included in the region 11a. The load transistor 3 functions as a current source that controls a current flowing in the pixels 1. The drain of the load transistor 3 is connected to the signal line 2. Although included within the well 14a in FIG. 1, the capacitor 5 and the switch 6 are not always necessarily formed within the well 14a but instead may be formed in another well, for example, an N-type well. The signal line 2 is connected to an input terminal of the readout circuit 4, and the readout circuit 4 performs processes such as amplification, AD conversion, or the like to a signal from the pixel 1 output to the signal line 2 and outputs the processed signal. The region 12a may include a P-type well and an N-type well. FIG. 1 illustrates either one of the P-type well and the N-type well as a well 15a. At least a part of the readout circuit 4 is arranged in the well 15a.

One terminal of the capacitor 5 is connected to the gate of the load transistor 3. Further, one terminal of the switch 6 is connected to the gate of the load transistor 3. The other terminal of the switch 6 is connected via a voltage wiring to the voltage generating circuit 7a that supplies, to the gate of the load transistor 3, a voltage in accordance with an amount of current to be supplied to the pixel 1. In response to the switch 6 being turned on (in a connection state), a predetermined voltage generated by the voltage generating circuit 7a is applied to the capacitor 5. Then, in response to the switch 6 being turned off (in a disconnection state), the gate of the load transistor 3 is non-conducting with the voltage generating circuit 7a, allowing the gate voltage of the load transistor 3 to be held at a predetermined voltage. This can suppress a noise generated at the voltage generating circuit 7a from being transmitted to the gate of the load transistor 3. As discussed above, the voltage wiring to which a voltage is supplied from the voltage generating circuit 7a, a capacitor 5, and a switch 6 function as a control unit that controls a current flowing through the load transistor 3.

The vertical scanning circuit 8 scans rows to be read out by sequentially switching rows of the pixels 1 to be connected to the signal line 2. Note that the solid state imaging device may have a column memory (not illustrated) provided for each column of the plurality of pixels 1 and a horizontal scanning circuit (not illustrated). Each column memory on each column holds an output value of the readout circuit 4 on a corresponding column. The horizontal scanning circuit scans each of the column memories in a horizontal direction, and signals held in the column memories are sequentially output.

A ground wiring 20 (a first reference potential wiring) is arranged on the pixel region 10. The ground wiring 20 is connected to a well 13 in which the plurality of pixels 1 are formed via contacts (first well contacts), and supplies a ground potential (a reference potential) to the well 13. A ground wiring 21a (a second reference potential wiring) is arranged on the regions 11a and 12a, and a ground wiring 21b is arranged on the regions 11b and 12b. The ground wiring 21a is connected to the wells 14a and 15a via contacts and supplies a ground potential to the wells 14a and 15a. The ground wiring 21b is connected to wells 14b and 15b via contacts and supplies a ground potential to the wells 14b and 15b. The source of the load transistor 3 is connected to a ground wiring 21a at a point B (a connection point B). A ground terminal of the readout circuit 4 is connected to the ground wiring 21a at a point C (a connection point C). A pad 23 is connected to the ground wiring 21a, and a pad 24 is connected to the ground wiring 21b. The ground potential is supplied to the pads 23 and 24 from the external of the solid state imaging device. The ground wiring 20 and the ground wiring 21a are connected by the connection portion 22a (these may collectively referred to as a reference potential wiring). The ground wiring 20 and the ground wiring 21b are connected by the connection portion 22b. The connection portions 22a and 22b are formed of wirings having a higher resistance than the ground wiring 20, 21a, and 21b, as described later. Of the two terminals of the capacitor 5, one of the terminals which is not connected to the gate of the load transistor 3 (a control terminal) is connected to the ground wiring 20 at a point A (a connection point A). Note that, although the ground wirings 20, 21a, and 21b each are illustrated as a form of region for simplified illustration, the ground wirings 20, 21a, and 21b are arranged among ground terminals of respective pixels 1 in an actual implementation.

Figure 2A:
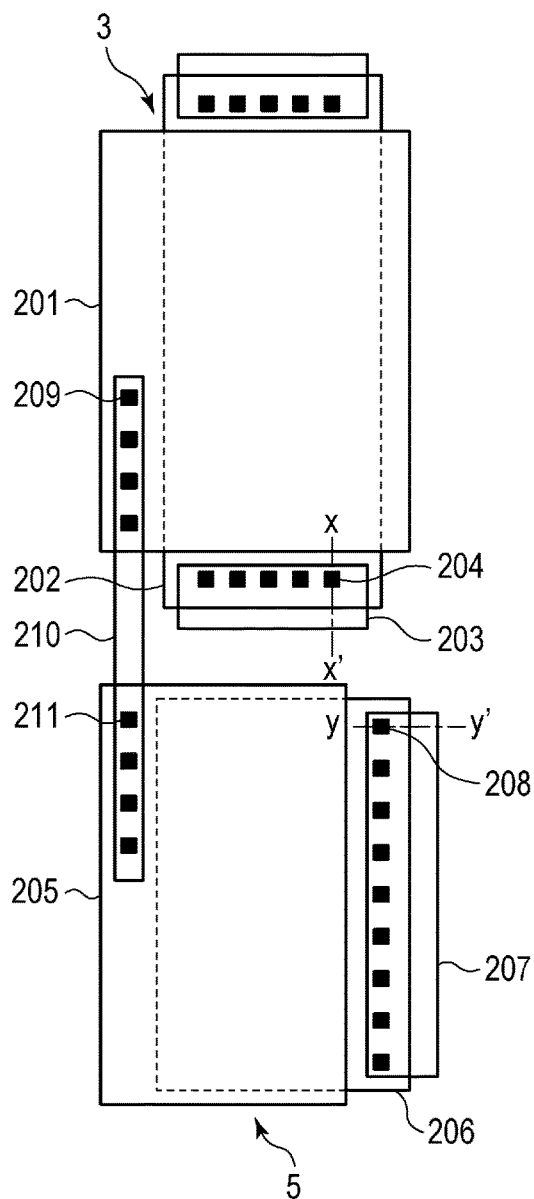
FIG. 2A is a plan view illustrating structure around a point A and a point B of the solid state imaging device according to the first embodiment.
Figure 2B:
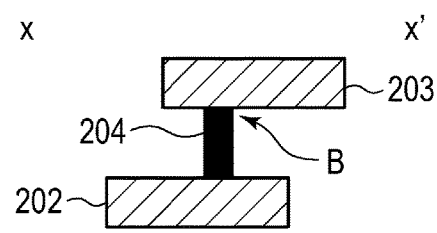
FIG. 2B and FIG. 2C are sectional views illustrating structure around the point A and the point B of the solid state imaging device according to the first embodiment.
Figure 2C:
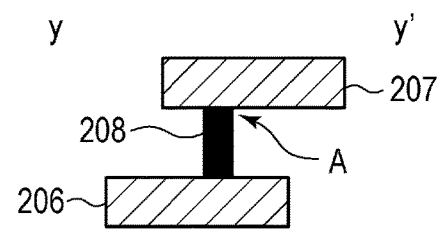

With reference to FIG. 2A, FIG. 2B, and FIG. 2C, the structure around the point A and the point B in FIG. 1 will be described. FIG. 2A is a layout plan view of the load transistor 3 and the capacitor 5. Elements having the same function as described in FIG. 1 are labeled with the same reference numerals. In FIG. 2A, a gate 201 of the load transistor 3 is connected to one terminal 205 of the capacitor 5 via contacts 209, a wiring 210, and contacts 211 in this order. A source 202 of the load transistor 3 is connected to a wiring 203 via contacts 204. The wiring 203 is connected to the ground wiring 21a illustrated in FIG. 1. The other terminal 206 of the capacitor 5 is connected to the wiring 207 via contacts 208. The wiring 207 is connected to the ground wiring 20 illustrated in FIG. 1. FIG. 2B is a sectional view taken along a line x-x' of FIG. 2A. As illustrated in FIG. 2B, a connection point of the contact 204 and the wiring 203 corresponds to the point B in FIG. 1. FIG. 2C is a sectional view taken along in a line y-y' of FIG. 2A. As illustrated in FIG. 2C, a connection point of the contact 208 and the wiring 207 corresponds to the point A in FIG. 1. Note that, while a plurality of the contacts 204 and a plurality of the contacts 208 may be provided as illustrated in FIG. 2A, a single contact 204 and/or a single contact 208 may be provided. When a plurality of the contacts 204 and a plurality of the contacts 208 may be provided, respective connection points corresponding to the point A and the point B are selected such that the distance between the point A and the point B is the shortest as illustrated in FIG. 2A.

Figure 3A:
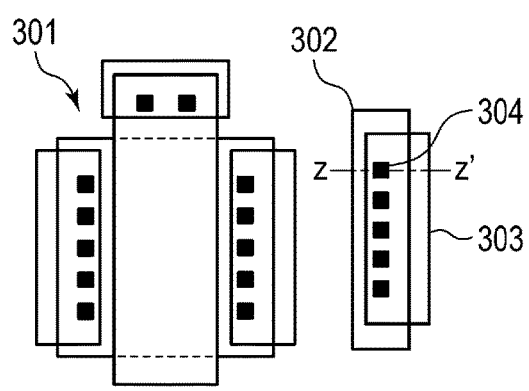
FIG. 3A is a plan view illustrating structure around a point C of the solid state imaging device according to the first embodiment.
Figure 3B:
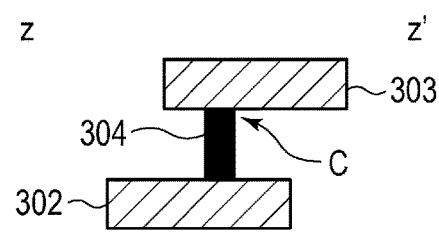
FIG. 3B is a sectional view illustrating structure around the point C of the solid state imaging device according to the first embodiment.

With reference to FIG. 3A and FIG. 3B, the structure around the point C in FIG. 1 will be described in detail. FIG. 3A is a layout plan view of a transistor 301, which is one of the transistors forming the readout circuit 4, and a well contact adjacent thereto. The transistor 301 is formed in the wells 15a and 15b illustrated in FIG. 1. A region 302 adjacent to the transistor 301 is a region that supplies a ground potential to a well (a second well) in which the transistor 301 is formed. Therefore, the region 302 is an impurity diffusion region having the same conductivity type as the well and having a high impurity concentration. The region 302 is connected to a wiring 303 via contacts 304 (second well contacts). The wiring 303 is connected to the ground wiring 21a illustrated in FIG. 1. Such a connection relationship causes the ground potential to be supplied to the well in which the transistor 301 is formed. FIG. 3B is a sectional view taken along a line z-z' of FIG. 3A. As illustrated in FIG. 3B, a connection point of the contact 304 and the wiring 303 corresponds to the point C in FIG. 1. Note that, while a plurality of the contacts 304 may be provided, a single contact 304 may be provided. When a plurality of the contacts 304 are provided, a connection point that is the closest to the point B is selected as the point C.

FIG. 4A, FIG. 4B, and FIG. 4C are plan views illustrating the structure of the connection portion 22a. Elements having the same function as described in FIG. 1 are labeled with the same reference numerals. FIG. 4A is a view illustrating an example of the structure of the connection portion 22a. The connection portion 22a includes an intermediate wiring 403 that turns to the left and the right (in the direction parallel to a column of the plurality of pixels 1). The intermediate wiring 403 is a wiring that connects the ground wiring 20 and the ground wiring 21a each other. The shape of the intermediate wiring 403 is not limited to the one that turns to the left and the right, and may be one that turns upward and downward (in a direction parallel to a row of the plurality of pixels 1 or a direction intersecting a column of the plurality of pixels 1), for example. Such structure allows for an increase in the resistance of the connection portion 22a compared to the case where the intermediate wiring 403 is shaped straight to connect the ground wiring 20 and the ground wiring 21*a* by the shortest distance, for example.

FIG. 4B is a view illustrating another example of the structure of the connection portion 22*a*. The connection portion 22*a* includes an intermediate wiring 404 branched near the pad 23. In this configuration, the distance between the ground wiring 20 and the pad 23 is longer than the gap between the ground wiring 20 and the ground wiring 21*a*. That is, the length of the intermediate wiring 404 is longer than the gap between the ground wiring 20 and the ground wiring 21*a*. This allows for an increase in the resistance of the connection portion 22*a* compared to the case where the intermediate wiring 404 is shaped straight to connect the ground wiring 20 and the ground wiring 21*a* by the shortest distance, for example.

FIG. 4C is a view illustrating another example of the structure of the connection portion 22*a*. The connection portion 22*a* includes a region 401, contacts 402 and 406, and intermediate wirings 405 and 407. The intermediate wiring 405 connected to the ground wiring 20 is connected to the region 401 via the contact 402. The region 401 is connected to the intermediate wiring 407 connected to the ground wiring 21*a* via the contact 406. The region 401 is formed of a well that is a semiconductor region arranged on the semiconductor substrate or formed of polysilicon disposed on the semiconductor substrate. That is, the region 401 is arranged in a layer that is different from the intermediate wirings 405 and 407. Since a well and polysilicon have a resistivity higher than a metal wiring, the region 401 formed of a well or polysilicon allows for an increase in the resistance compared to the case where the connection portion 22*a* is formed of a metal wiring. Further, since the contact 402 has a resistance, the contact 402 also contributes to increase the resistance of the connection portion 22*a*. Therefore, the region 401 may be formed of a metal instead of a well or polysilicon. Also in this case, compared to the case where the connection portion 22*a* is formed of a metal wiring only, the resistance of the connection portion 22*a* is increased due to the resistance of the contact 402.

In the present embodiment, the connection portion 22*a* may have any structure of FIG. 4A, FIG. 4B, and FIG. 4C or a combination thereof. While the path from the point A to the point B runs via the connection portion 22*a*, the path from the point B to the point C does not run via the connection portion 22*a*. Therefore, increasing the resistance of the connection portion 22*a* as illustrated in FIG. 4A, FIG. 4B, and FIG. 4C allows the resistance between the point A and the point B to be larger than the resistance between the point B and the point C. That is, a relationship of "the resistance between the point A and the point B">"the resistance between the point B and the point C" is established. Note that, although the ground wiring 20 and the ground wiring 21*a* are connected at a single location by the connection portion 22*a* in FIG. 1, a plurality of the connection portions 22*a* may be provided and the ground wiring 20 and the ground wiring 21*a* may be connected at multiple locations in parallel. Connecting the ground wiring 20 and the ground wiring 21*a* at multiple locations allows for a smaller difference among the resistances of the ground wirings 20 and 21*a* that are added between respective elements.

Further, in FIG. 1, a point H (a connection point H) is a connection point of a well contact and the ground wiring 20, in which the connection point is located in the closest position to one of the pixels 1 which is the closest to the load transistor 3 of the plurality of pixels 1 connected to the signal line 2. A point J (a connection point J) is a connection point of a well contact and the ground wiring 20 in which the connection point is located in the closest position to one of the pixels 1 that is the farthest from the load transistor 3 of the plurality of pixels 1 connected to the signal line 2. In this case, a relationship of "the resistance between the point H and the point J"<"the resistance between the point C and the point H" is established.

Figure 5:
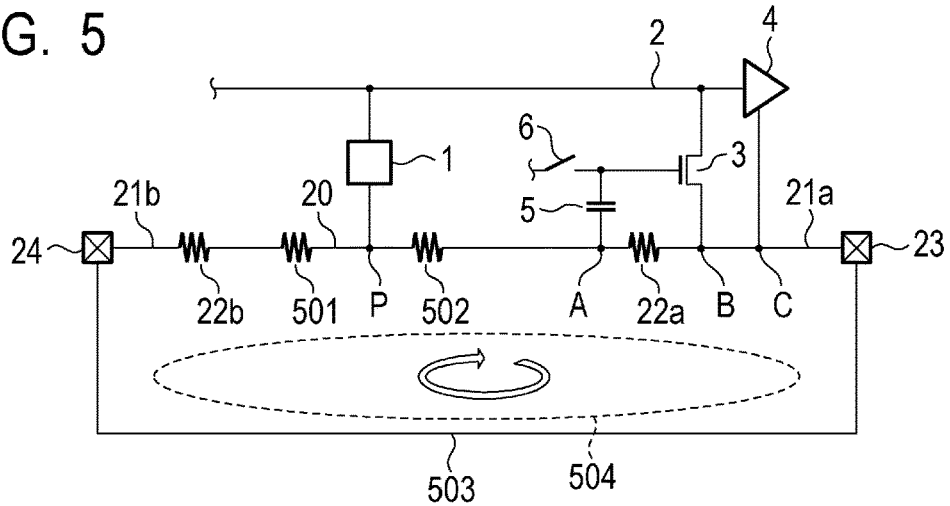
FIG. 5 is a circuit diagram of a signal line and a ground loop of the solid state imaging device according to the first embodiment.

FIG. 5 is a circuit diagram of a signal line and a ground loop of the solid state imaging device according to the first embodiment. In FIG. 5, elements having the same function as described in FIG. 1 are labeled with the same reference numerals. Further, a connection point of the pixel 1 in interest and the ground wiring 20 is denoted as a point P. Furthermore, each parasitic resistance of the ground wirings and the like is depicted by a circuit symbol of a resistor. In this figure, resistances 501 and 502 represent parasitic resistances of the ground wiring 20. The resistance 501 is a parasitic resistance between the point P and the connection portion 22*b*, and the resistance 502 is a parasitic resistance between the point P and the connection portion 22*a* (or the point A). A distribution of the resistances between the resistance 501 and the resistance 502 changes depending on the position of the pixel 1 connected to the signal lines 2. When the parasitic resistance of the entire ground wiring 20 is R0, the resistances of the resistance 501 and the resistance 502 are expressed by R0×(1−x) and R0×x, respectively, by using x that satisfies 0≤x≤1. The value of x changes depending on the position of the pixel 1 and, for the plurality of pixels connected to the signal lines 2, x=0 when the pixel 1 is the pixel closest to the readout circuit 4 and x=1 when the pixel 1 is the pixel farthest from the readout circuit 4.

The resistances of the connection portions 22*a* and 22*b* are resistances that are intentionally provided by using the scheme exemplified in FIG. 4A, FIG. 4B, or FIG. 4C. In this example, each of the resistances of the connection portions 22*a* and 22*b* may be R1. Further, the resistances of the ground wirings 21*a* and 21*b* will be ignored because of being sufficiently smaller than the resistances of the connection portions 22*a* and 22*b*. A ground wiring 503 to which the pads 23 and 24 are connected represents a ground wiring within a substrate or a package where the solid state imaging device is implemented. The resistance of the ground wiring 503 will be ignored for simplified illustration. The pad 23 and the pad 24 are connected each other by the ground wiring 503, and thereby the ground wirings 20, 21*a*, 21*b*, 22*a*, 22*b*, and 503 form a loop 504 (a ground loop). In response to a temporal change in the magnetic flux penetrating the loop 504 due to a fluctuation of the magnetic field around the solid state imaging device, an induced electromotive force occurs in the loop 504 according to the law of electromagnetic induction. A magnitude of the induced electromotive force V is expressed by V=−dΦ/dt, where the magnetic flux penetrating the loop 504 is Φ. A situation where a magnetic field fluctuates may occur when a coil is located around the solid state imaging device and thus the current of the coil temporarily changes, for example. More specifically, when the solid state imaging device is mounted in an imaging system such as a camera, a coil included in a motor for driving a lens of the camera may generate such a change of the magnetic field as described above, for example.

With reference to FIG. 5, the advantageous effects of present embodiment will be described. It is assumed that the magnetic flux penetrating the loop 504 temporarily changes and an induced electromotive force V occurs in the direction of a depicted arrow. Due to this induced electromotive force V, an induced current I flows in the loop 504 in the direction of the arrow, and voltage drops occur at respective resistances. By using the induced electromotive force V and the resistances R0 and R1, the magnitude of the induced current I is expressed by $I=V/(R0+2\times R1)$.

The potential of the point P to which the pixel 1 is connected is higher by a voltage drop at the resistance 502 and the connection portion 22a, namely, $I\times(R0\times x+R1)=V\times(R0\times x+R1)/(R0+2\times R1)$ than the potential of the point C that is a reference ground (a reference potential) of the readout circuit 4. A relative fluctuation of the ground potential of the point P to the point C is transmitted to the signal line 2 according to a transfer function S from the pixel 1 to the signal line 2. Therefore, the potential of the signal line 2 is higher by $Vnpix=S\times V\times(R0\times x\times R1)/(R0+2\times R1)$ than that in the case where there is no potential fluctuation as described above. That is, a fluctuation in the ground potential of the point P relative to the point C causes a noise Vnpix to occur on the signal line 2. In this way, the noise Vnpix transmitted to the signal line 2 through the ground of the pixel 1 changes in a same phase with a ground potential fluctuation of the point P relative to the point C.

Further, the potential of the point A is higher by a voltage drop at the connection portion 22a, namely, $I\times R1=V\times R1/(R0+2\times R1)$ than that of the point B. A fluctuation in the potential of the point A is transmitted to the gate of the load transistor 3. For simplicity, a transfer amount from the point A to the gate of the load transistor 3 is assumed to be 100%. In this case, the gate potential of the load transistor 3 is higher by $V\times R1/(R0+2\times R1)$ than the source potential. The pixel 1, the signal line 2, and the load transistor 3 can be now considered as a grounded source amplification circuit whose input is the gate of the load transistor 3 and whose load is the pixel 1. The magnitude of the gain of this grounded source amplification circuit is expressed by $Gm\times Rout$, where the transconductance of the load transistor 3 is Gm and the output resistance of the pixel 1 is Rout. Since the grounded source amplification circuit is an inverting amplification circuit, the potential of the signal line 2 decreases by $Vntr=Gm\times Rout\times V\times R1/(R0+2\times R1)$. That is, a fluctuation in the ground potential of the point A relative to the point B causes a noise Vntr to occur on the signal line 2. In such a way, the noise Vntr transmitted to the signal line 2 through the load transistor 3 changes in a phase opposite to a ground potential fluctuation of the point A relative to the point B. Further, the noise Vntr can be controlled by adjusting values of Gm and Rout. The value Rout can be adjusted by changing the transconductance of transistors of an amplification section within the pixel 1, for example. Further, the transconductance can be adjusted by changing a channel length or a channel width of a transistor.

As described above, since a fluctuation in the ground potential is caused by the induced current I, a fluctuation of the ground potential of the point P relative to the point C is in a same phase with a fluctuation of the ground potential of the point A relative to the point B. Thus, the noise Vnpix transmitted to the signal line 2 via the pixel 1 and the noise Vntr transmitted to the signal line 2 via the load transistor 3 are of the opposite phase to each other. Therefore, since the noise Vnpix and the noise Vntr are cancelled each other, noise which may occur on the signal line 2 can be reduced.

On the other hand, when the ground wiring 20 and the ground wiring 21a are short-circuited and thus the connection portion 22a is not provided, or when the connection portion 22a has a significantly low resistance, R1=0 is obtained. In such a comparison example, since the noise Vntr via the load transistor 3 is zero, noise transmitted to the signal line 2 is only a noise via the pixel 1. In this case, noise transmitted to the signal line 2 is expressed by $Vn=S\times V\times x$.

Figure 6:
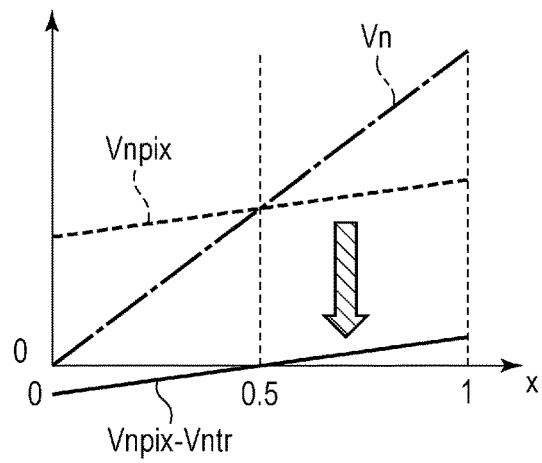
FIG. 6 is a graph illustrating advantageous effects of the first embodiment.

FIG. 6 is a graph illustrating a noise reduction effect of the present embodiment. The horizontal axis represents x indicating a position of the pixel 1, and the vertical axis represents the magnitude of noises. A dot-dashed line represents a noise Vn transmitted to the signal line 2 in the comparison example described above. The noise Vn is the maximum at x=1, and the value of the noise Vn at this time is $S\times V$. On the other hand, no noise occurs at x=0 because of Vn=0. Since the maximum value is the critical parameter in terms of an influence of noise on the image quality degradation, however, it is important to reduce the maximum value at x=1. A dashed line represents the noise Vnpix transmitted from the pixel 1 to the signal line 2 in the configuration of the present embodiment. The noise Vnpix is the maximum at x=1, and the value thereof at this time is $S\times V\times(R0+R1)/(R0+2\times R1)$. That is, the maximum value of the noise Vnpix is smaller than the maximum value of the noise Vn. As such, an influence on the image quality degradation due to noise transmitted from the pixel 1 to the signal line 2 can be reduced by providing the connection portion 22a having the resistance R1 between the ground wiring 20 and the ground wiring 21a.

Furthermore, a solid line in FIG. 6 represents a noise (Vnpix−Vntr) of the present embodiment in which noise is minimized by adjusting the noise Vntr transmitted to the signal line 2 via the load transistor 3. In order to minimize the range of the noise (Vnpix−Vntr), the Vntr is adjusted such that (Vnpix−Vntr) becomes zero at x=0.5. That is, $Gm\times Rout=S\times(R0+2\times R1)/(2\times R1)$ is established to have Vnpix=Vntr at x=0.5. In this case, while being maximum at x=1, the noise can be reduced to $S\times V\times R0/(R0+2\times R1)/2$. It is understood from the equation of the noise at x=1 that a larger R1 relative to R0 allows for a larger reduction effect of the noise. When the resistance R1 of the connection portion 22a can be set sufficiently large so that R0 is much larger than R1 (R0<<R1), noise occurring in the solid state imaging device of the present embodiment becomes close to zero.

As discussed above, according to the present embodiment, a potential fluctuation of the gate of the transistor 3 (the point A) relative to the source of the load transistor 3 (the point B) is in a same phase with a potential fluctuation of the ground of the pixel 1 (the point P) relative to the ground of the readout circuit 4 (the point C). Here, the pixel 1, the signal line 2, and the load transistor 3 form an inverting amplification circuit. Thus, the noise Vntr occurring on the signal line 2 due to a potential fluctuation of the point A relative to the point B is of the opposite phase to the noise Vnpix caused by a potential fluctuation of the point P relative to the point C. Thereby, the noise Vntr and the noise Vnpix are cancelled each other on the signal line 2, and noise that may be caused by the magnetic field around the solid state imaging device can be reduced or eliminated to zero.

Note that an excessively increased resistance R1 of the connection portion 22a may result in an excessively large ground resistance of the pixel region. In this case, due to coupling to driving pulses of the pixel or the like, a fluctuation of the ground potential of the pixel region may not be converged and thus image degradation such as shading is likely to be caused. For such a reason, in a design in which ground wirings only are considered as a source of a parasitic resistance as described above, although it may be possible to reduce noise, it may be difficult to eliminate it to zero. With a design that also takes into consideration of the parasitic resistances of the signal lines 2, however, it will be possible to eliminate noise to zero without setting R1 to so high a resistance. A design that takes the parasitic resistances of the signal lines 2 into consideration will be described below.

Figure 7:
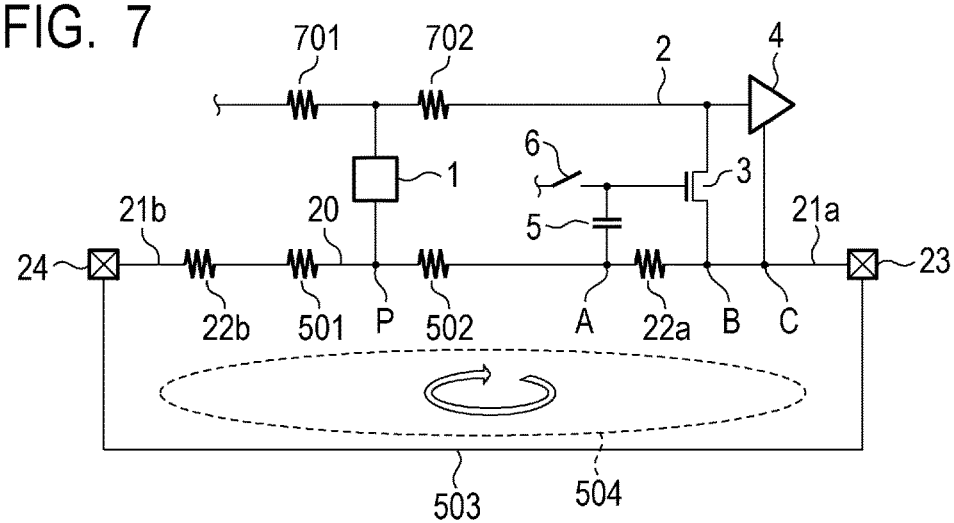
FIG. 7 is a circuit diagram of a signal line and a ground loop of the solid state imaging device according to the first embodiment.

FIG. 7 is a circuit diagram of a signal line and a ground loop when parasitic resistances of the signal line is further considered in FIG. 5. Elements having the same function as described in FIG. 5 are labeled with the same numeral references. The resistance 701 and the resistance 702 represent parasitic resistances of the signal line 2. The resistance 702 is a parasitic resistance of the signal line 2 between the pixel 1 and the drain of the load transistor 3. The resistance 701 is a parasitic resistance of the remaining section of the signal line 2 other than the section described above. By using x representing the position of the pixel 1, the resistances of the resistance 701 and the resistance 702 are expressed by r×(1−x) and r×x, respectively, where the entire parasitic resistance of the signal line 2 is denoted as r. When r is not ignorable relative to the output resistance Rout of the pixel 1, the magnitude of the gain when the pixel 1, the signal line 2, and the load transistor 3 are considered as a grounded source amplification circuit is Gm×(Rout+r×x). Therefore, a noise transmitted to the signal line 2 will be Vntr=Gm×(Rout+r×x)×V×Rl/(R0+2×R1), in which Vntr also has a dependency on x. Thus, with consideration of the parasitic resistances r of the signal lines 2, the terms in Vnpix and Vntr which depend on x are designed so as to be cancelled each other and the terms in Vnpix and Vntr which do not depend on x are designed so as to be cancelled each other, which can eliminate noise to zero without setting R1 to so high a resistance.

Second Embodiment

The second embodiment is different from the first embodiment in that a relay portion 801a is provided between the ground wirings 20 and 21a and a ground-side terminal of the capacitor 5 is connected to the point A on the relay portion 801a. In describing the present embodiment, description of subjects similar to those in the first embodiment may be simplified or omitted.

Figure 8:
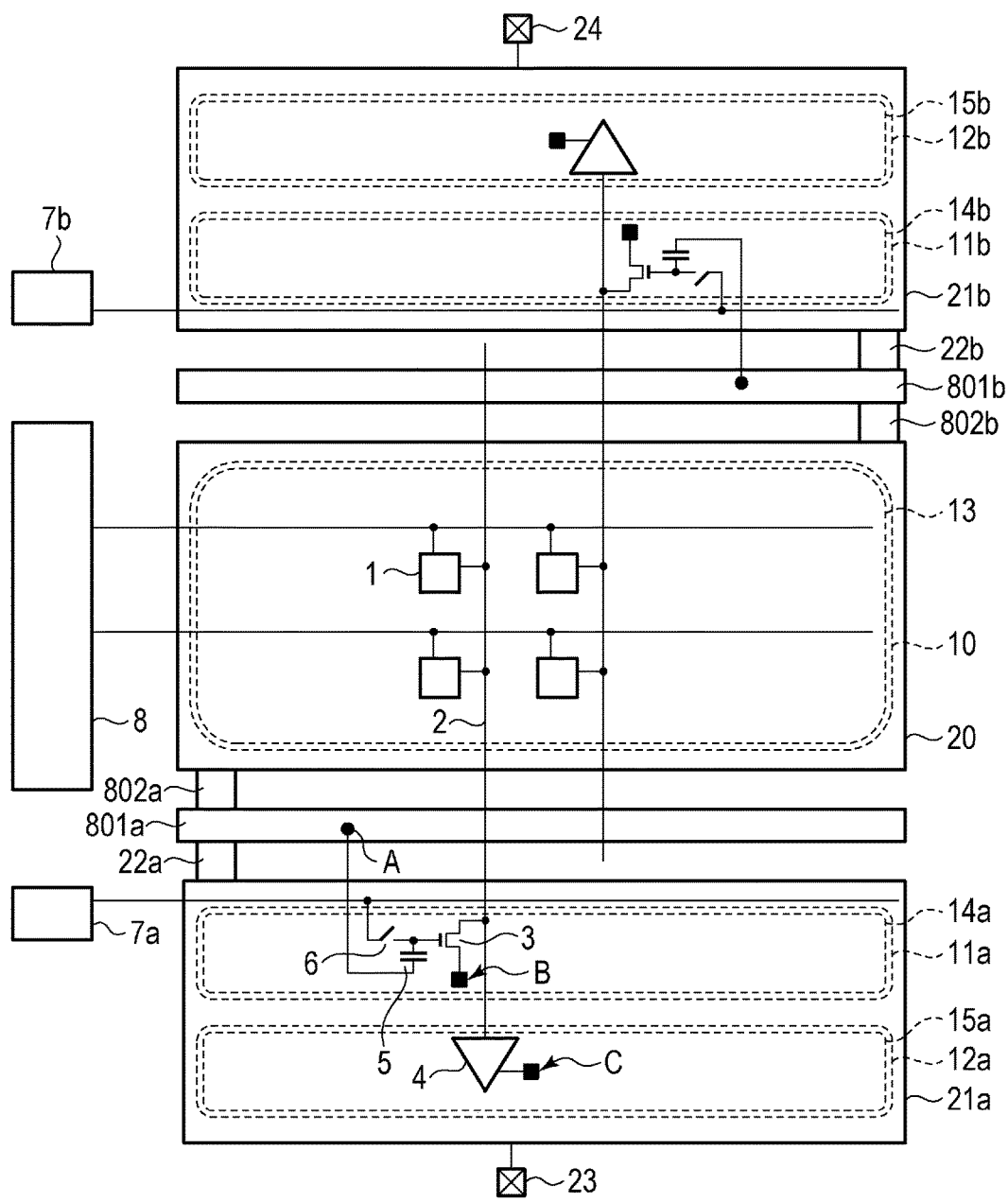
FIG. 8 is a diagram illustrating a configuration of a solid state imaging device according to a second embodiment.

FIG. 8 is a diagram illustrating the configuration of a solid state imaging device of the present embodiment. Elements having the same function as described in FIG. 1 are labeled with the same reference numerals. In the present embodiment, a relay portion 801a is provided between the ground wirings 20 and 21a, and a relay portion 801b is provided between the ground wirings 20 and 21b. The ground wiring 21a and the relay portion 801a are connected via a connection portion 22a, and the relay portion 801a and the ground wiring 20 are connected via the connection portion 802a. The ground wiring 21b and the relay portion 801b are connected via a connection portion 22b, and the relay portion 801b and the ground wiring 20 are connected via the connection portion 802b. The configuration of the connection portions 22a, 22b, 802a, and 802b may be, for example, any of those in FIG. 4A, FIG. 4B, and FIG. 4C or may be a combination thereof.

While the relay portion 801a is connected to the ground wirings 20 and 21a each at one location by the connection portions 22a and 802a, respectively, in FIG. 8, the relay portion 801a may be connected to the ground wirings 20 and 21a each at multiple locations. Of the two terminals of the capacitor 5, one of the terminals which is not connected to the gate of the load transistor 3 is connected to the relay portion 801a at the point A.

Figure 9:
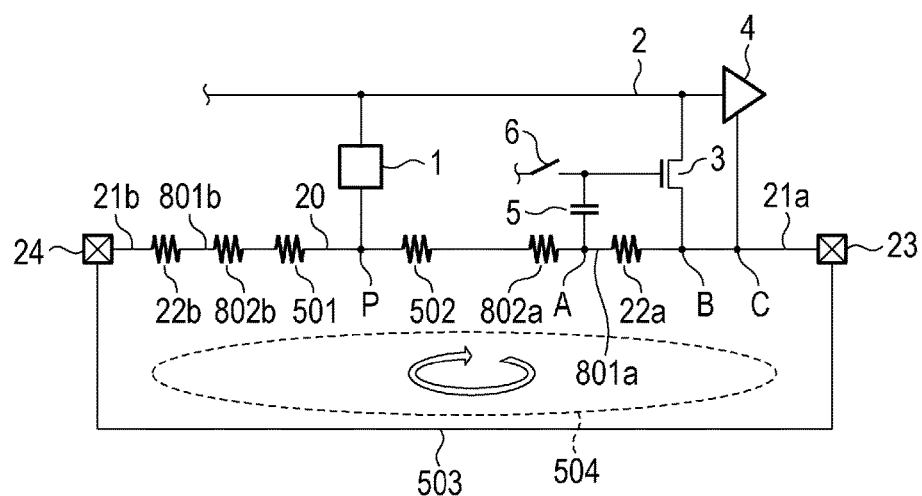
FIG. 9 is a circuit diagram of a signal line and a ground loop of the solid state imaging device according to the second embodiment.

FIG. 9 is a circuit diagram of a signal line and ground loop of the solid state imaging device according to the second embodiment. Elements having the same function as described in FIG. 5 are labeled with the same reference numerals. The circuit of FIG. 9 is different from the circuit of FIG. 5 in that resistances corresponding to the connection portions 802a and 802b are added and that the point A is located in the relay portion 801a between the connection portions 22a and 802a. A sum of the resistances of the connection portion 22a and the connection portion 802a is now denoted as R1. With a coefficient y that satisfies 0≤y≤1, the resistances of the connection portion 22a and the connection portion 802a are expressed by R1×(1−y) and R1×y, respectively.

With reference to FIG. 9, the advantageous effects of the present embodiment will be described. It is assumed that a magnetic flux penetrating the loop 504 temporarily changes and an induced electromotive force V occurs in a direction of a depicted arrow. At this time, the noise Vnpix transmitted to the signal line 2 via the pixel 1 is the same as the first embodiment, namely, Vnpix=S×V×(R0×x+R1)/(R0+2×R1). On the other hand, because a voltage drop between the point A and the point B will be y×V×R1/(R0+2×R1), the noise Vntr transmitted to the signal line 2 via the load transistor 3 is expressed by Vntr=y×Gm×Rout×V×R1/(R0+2×R1). Therefore, the noise Vntr becomes smaller than that in the case of the first embodiment because of being multiplied by the coefficient y that is smaller than or equal to 1. That is, in the present embodiment, because of the circuit configuration in which only a part of a voltage drop generated at the connection portion is applied between the source and the gate of the load transistor 3, noise transmitted to the signal line 2 via the load transistor 3 can be reduced. Therefore, in setting a parameter to cause at least a part of the noise Vnpix and the noise Vntr to be cancelled each other, Gm×Rout can be larger than that in the first embodiment, which can improve flexibility of design.

As discussed above, according to the present embodiment, the same advantageous effects of the noise reduction as seen in the first embodiment can be obtained. In addition, the present embodiment can improve flexibility of design.

Third Embodiment

In the first embodiment and the second embodiment, of the two terminals of the capacitor 5, one of the terminals which is not connected to the gate of the load transistor 3 is connected at the point A to the ground wiring 20 or to the relay portion 801a. In contrast, the third embodiment is different from the first embodiment and the second embodiment in that a back-gate (a control terminal) of the load transistor 3 is connected to the ground wiring 20 at the point A. In the present embodiment, description of subjects similar to those in the first embodiment or the second embodiment may be simplified or omitted.

Figure 10:
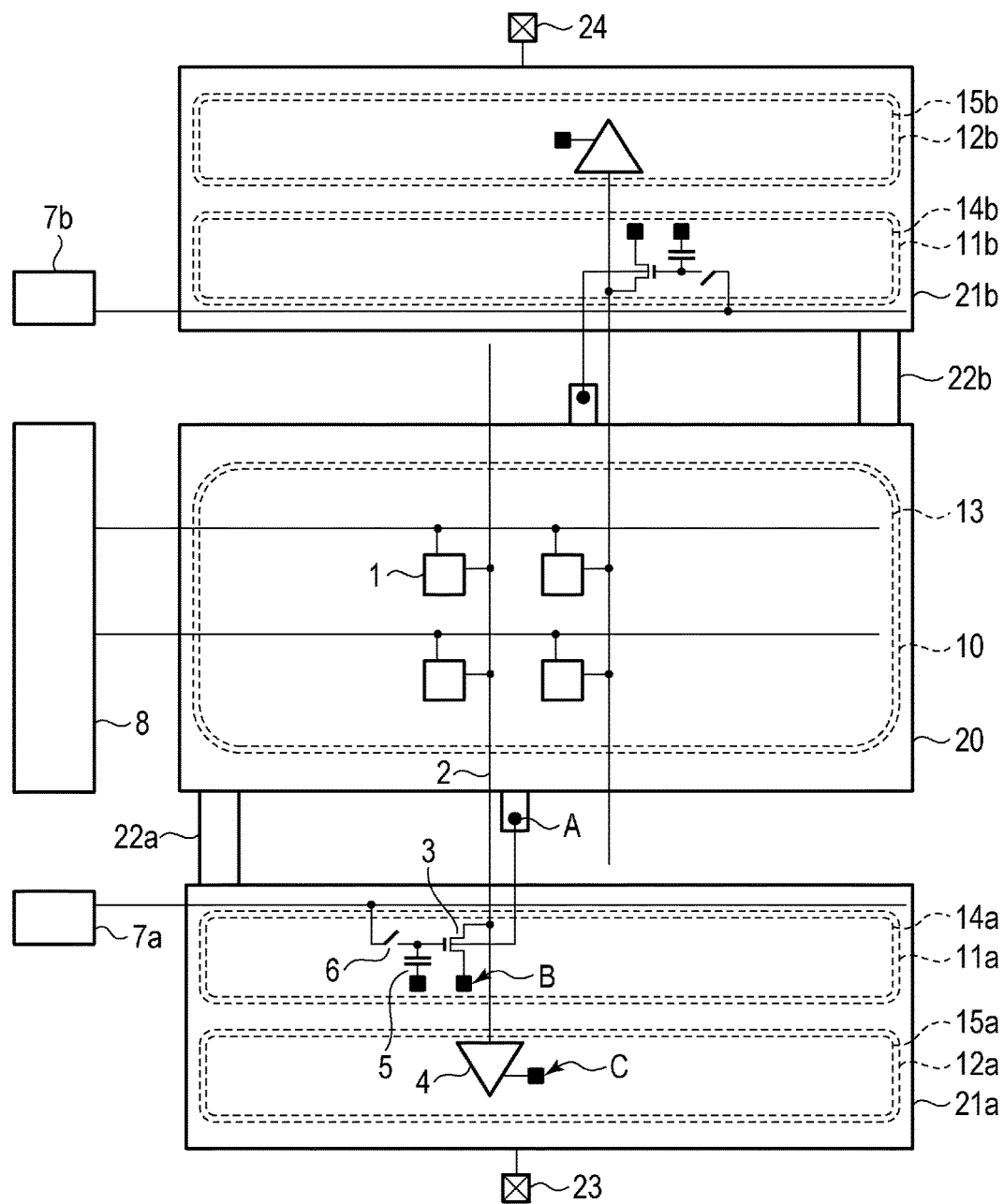
FIG. 10 is a diagram illustrating a configuration of a solid state imaging device according to a third embodiment.

FIG. 10 is a diagram illustrating the configuration of a solid state imaging device of the present embodiment. Elements having the same function as described in FIG. 1 are labeled with the same reference numerals. Of the two terminals of the capacitor 5, one of the terminals which is not connected to the gate of the load transistor 3 is connected to the ground wiring 21a via a contact. The load transistor 3 has a back-gate, and the back-gate is connected to the ground wiring 20 at the point A.

Figure 11A:
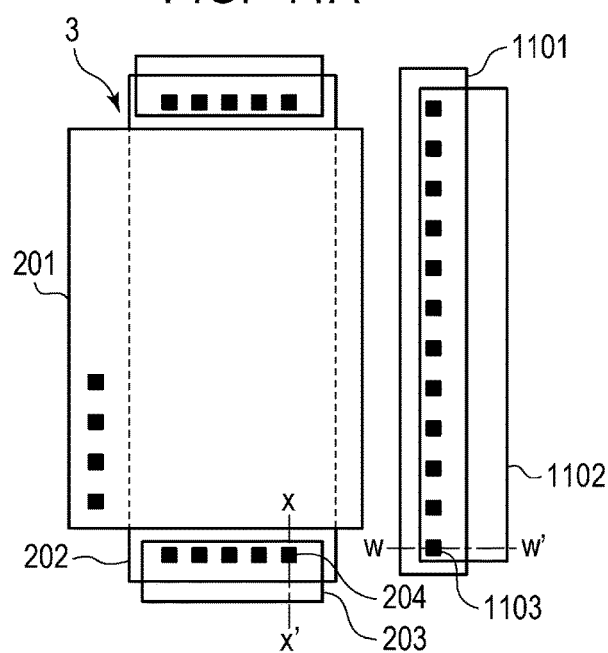
FIG. 11A is a plan view illustrating structure around a point A and a point B of the solid state imaging device according to the third embodiment.
Figure 11B:
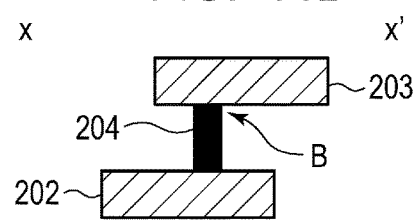
FIG. 11B and FIG. 11C are sectional views illustrating structure around the point A and the point B of the solid state imaging device according to the third embodiment.
Figure 11C:
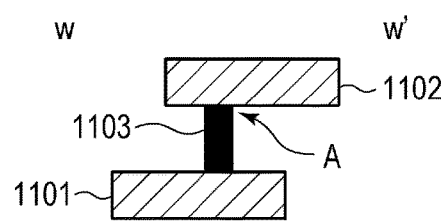

With reference to FIG. 11A, FIG. 11B, and FIG. 11C, the structure around the point A and the point B in FIG. 10 will be described. Elements having the same function as described in FIG. 2A, FIG. 2B, and FIG. 2C are labeled with the same reference numerals. Further, description duplicated with that for FIG. 2A, FIG. 2B, and FIG. 2C will be omitted or simplified. FIG. 11A is a plan view of a well contact adjacent to the load transistor 3. The region 1101 is a region that supplies a ground potential to a well in which the load transistor 3 is formed. The load transistor 3 is formed within wells 14a and 14b illustrated in FIG. 10. Thus, the region 1101 is an impurity diffusion region that has the same conduction type as the wells 14a and 14b and has a high impurity concentration. The region 1101 is connected to a wiring 1102 via contacts 1103. The wiring 1102 is connected to the ground wiring 20 illustrated in FIG. 10, and a ground potential is supplied to the wells 14a and 14b from the ground wiring 20. FIG. 11B is a sectional view taken along a line x-x' of FIG. 11A. FIG. 11C is a sectional view taken along a line w-w' of FIG. 11A. As illustrated in FIG. 11B, a connection point of the contact 204 and the wiring 203 corresponds to the point B in FIG. 10. Further, as illustrated in FIG. 11C, a connection point of the contacts 1103 and the wiring 1102 corresponds to the point A in FIG. 10. Note that, while a plurality of the contacts 204 and a plurality of the contacts 1103 may be provided as illustrated in FIG. 11A, a single contact 204 and/or a single contact 1103 may be provided. When a plurality of the contacts 204 and a plurality of the contacts 1103 are provided, a connection point is selected as the point A and the point B so that the distance between the point A and the point B is the shortest as illustrated in FIG. 11A.

Figure 12:
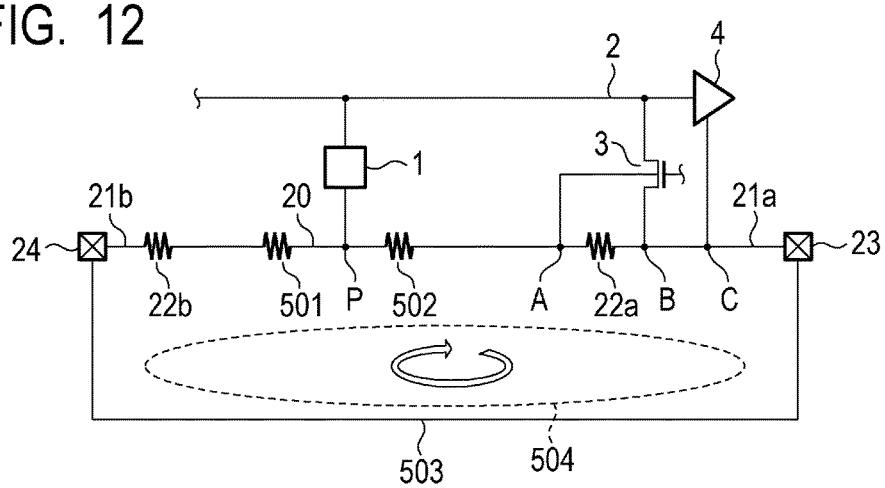
FIG. 12 is a circuit diagram of a signal line and a ground loop of the solid state imaging device according to the third embodiment.

FIG. 12 is a circuit diagram of a signal line and a ground loop of the solid state imaging device according to the third embodiment. Elements having the same function as described in FIG. 5 are labeled with the same reference numerals. The circuit of FIG. 12 is different from the circuit of FIG. 5 in that the back-gate of the load transistor 3 is connected to the point A located on the ground wiring 20 between the resistance 502 and the connection portion 22a. While the capacitor 5 and the switch 6 are connected to the gate of the load transistor 3 in the same manner as in FIG. 5, depiction thereof is omitted in FIG. 12 because the advantageous effects can be described without these elements.

With reference to FIG. 12, the advantageous effects of the present embodiment will be described. It is assumed that a magnetic flux penetrating the loop 504 temporarily changes and an induced electromotive force V occurs in a direction of a depicted arrow. At this time, the noise Vnpix transmitted to the signal line 2 via the pixel 1 is the same as that in the first embodiment, namely, $Vnpix=S\times V\times(R0\times x+R1)/(R0+2\times R1)$. In the present embodiment, a voltage corresponding to a voltage drop between the point A and the point B is applied to the back-gate. In this case, the pixel 1, the signal line 2, and the load transistor 3 can be considered as a grounded source amplification circuit whose load is the pixel 1 and whose input is the back-gate of the load transistor 3. The magnitude of the gain of this grounded source amplification circuit is expressed by Gmb×Rout, where the transconductance of the load transistor 3 when the back-gate is an input is Gmb and the output resistance of the pixel 1 is Rout. Note that $Gmb=d(Id)/d(Vbs)$ is established, where Id represents a drain current and Vbs represents a source to back-gate voltage. Therefore, the magnitude of a noise transmitted to the signal line 2 via the load transistor 3 is expressed by $Vntr=Gmb\times Rout\times V\times R1/(R0+2\times R1)$. Since the noise Vnpix and the noise Vntr are of the opposite phase to each other, the noise occurring on the signal line 2 can be reduced by adjusting Gmb×Rout with the same method as discussed in the first embodiment.

Note that, also in the present embodiment, the circuit configuration may be modified so that a relay portion may be provided as seen in the second embodiment and only a part of the voltage drop generated by the connection portion is applied to the back-gate. Such a configuration allows for increasing the Gmb×Rout and thus can improve flexibility of design for the same reason as described in the second embodiment.

Further, the present embodiment may be modified to together employ the configuration of the first embodiment in which one terminal of the capacitor 5 is connected to the point A. In this case, the noise Vntr transmitted to the signal line 2 via the load transistor 3 is a sum of a component transmitted from the gate side via the capacitor 5 and a component transmitted from the back-gate side. In this modified example, the design parameters are adjusted so that this sum and at least a part of the noise Vnpix transmitted from the pixel 1 are cancelled each other.

As discussed above, in the present embodiment, the noise caused by a magnetic field fluctuation can be reduced by using another configuration different from that of the first or second embodiment.

Fourth Embodiment

The present embodiment is different from the first to third embodiments in that the load transistor 3 and the readout circuit 4 connected to the signal line 2 on a single column are arranged in the opposite sides interposing the pixel region 10. In the present embodiment, description of the subjects similar to those in the first to third embodiments may be simplified or omitted.

Figure 13:
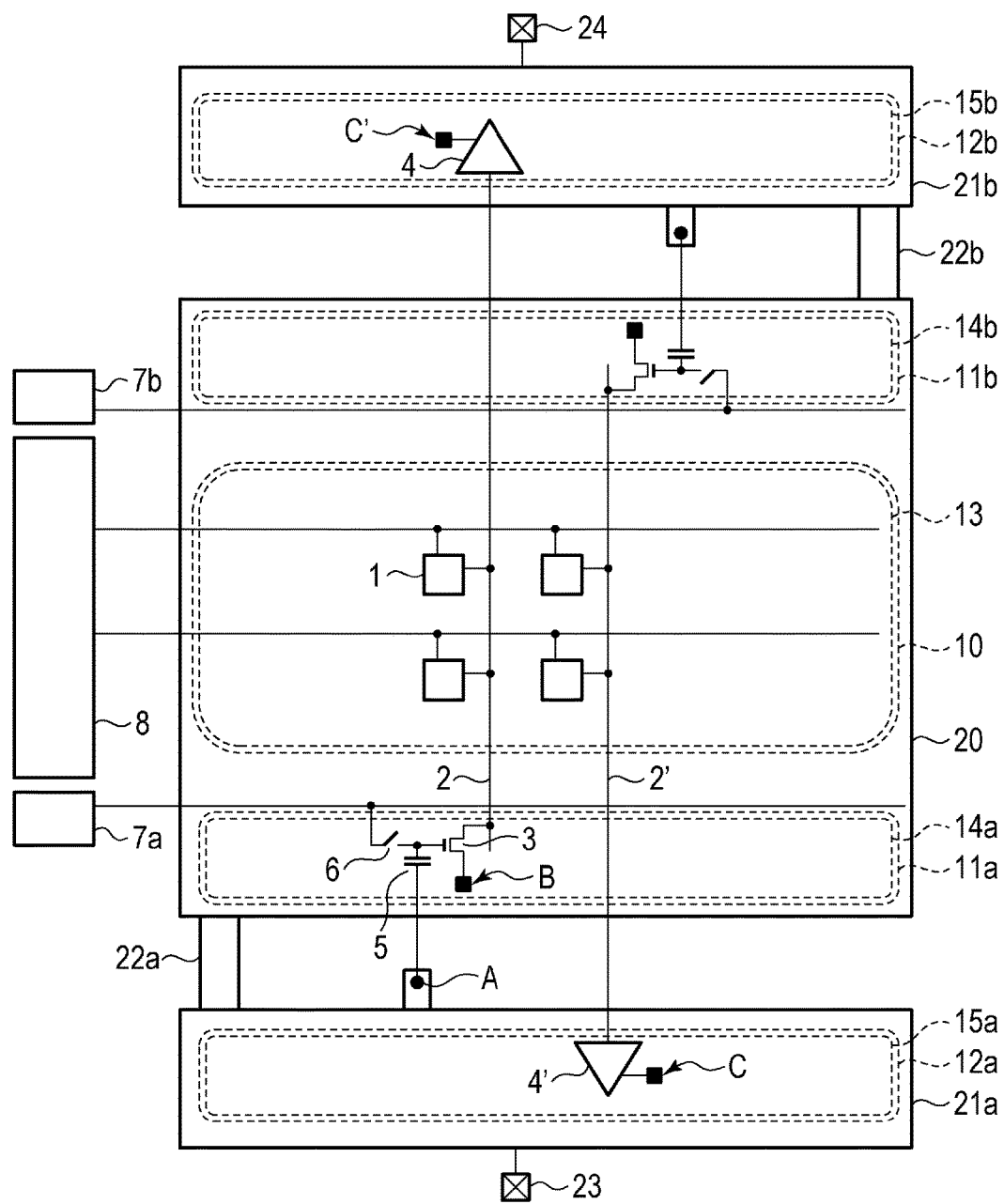
FIG. 13 is a diagram illustrating a configuration of a solid state imaging device according to a fourth embodiment.

FIG. 13 is a diagram illustrating the configuration of a solid state imaging device of the present embodiment. Elements having the same function as described in FIG. 1 are labeled with the same reference numerals. The load transistor 3, the capacitor 5, and the switch 6 corresponding to the signal line 2 on a single column are provided in the region 11a, and the readout circuit 4 connected to the signal line 2 on the same column is provided in the region 12b. That is, the load transistor 3, the capacitor 5, and the switch 6 are arranged in the side opposite to the readout circuit 4 interposing the pixel region 10. Of the terminals of the capacitor 5, one of the terminals which is not connected to the gate of the load transistor 3 is connected to the ground wiring 21a at the point A. The source of the load transistor 3 is connected to the ground wiring 20 at the point B. The ground terminal of the readout circuit 4 connected to the signal line 2 on the same column as that corresponding to this load transistor 3 is connected to the ground wiring 21b at the point C'. The readout circuit 4' is arranged in the region 12a in the same side as the load transistor 3 with respect to the pixel region 10. The readout circuit 4' is connected to a signal line 2' (a column adjacent to the signal line 2 in FIG. 13) that is on a column different from that corresponding to the signal line 2. The ground terminal of the readout circuit 4' is connected to the ground wiring 21a at the point C.

In the present embodiment, the connection portions 22a and 22b may have any structure of FIG. 4A, FIG. 4B, and FIG. 4C or a combination thereof. When the points A, B, C, and C' are set as described above, the path from the point A to the point B runs via the connection portion 22a, while the path from the point A to the point C does not run via the connection portion 22a. Therefore, increasing the resistance of the connection portion 22a as illustrated in FIG. 4A, FIG. 4B, and FIG. 4C results in that the resistance between the point A and the point B is larger than the resistance between the point A and the point C. That is, a relationship of "the resistance between the point A and the point B">"the resistance between the point A and the point C" is established. Note that, although the ground wiring 20 and the ground wiring 21*a* are connected at a single location by the connection portion 22*a* in FIG. 13, a plurality of the connection portions 22*a* may be provided and the ground wiring 20 and the ground wiring 21*a* may be connected at multiple locations in parallel.

Figure 14:
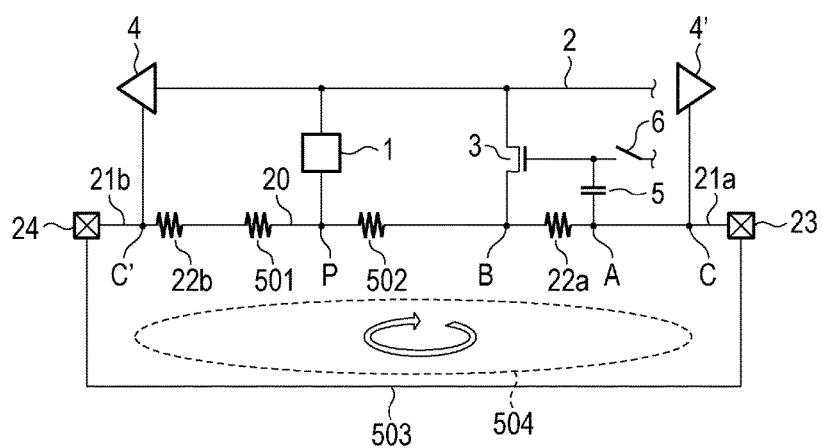
FIG. 14 is a circuit diagram of a signal line and a ground loop of the solid state imaging device according to the fourth embodiment.

FIG. 14 is a circuit diagram of a signal line and a ground loop of the solid state imaging device according to the fourth embodiment. In FIG. 14, elements having the same function as described in FIG. 5 are labeled with the same reference numerals. FIG. 14 is different from FIG. 5 in that the readout circuit 4 is located in the side opposite to the load transistor 3 interposing the pixels 1 on the signal line 2 and that the positions of point A and the point B are exchanged on a ground loop.

With reference to FIG. 14, advantages of the present embodiment will be described. It is assumed that a magnetic flux penetrating the loop 504 temporarily changes and an induced electromotive force V occurs in a direction of a depicted arrow. In this case, also in the present embodiment, a potential fluctuation of the point P relative to the point C' and a potential fluctuation of the point A relative to the point B are in a same phase with each other. Therefore, the noise Vnpix transmitted to the signal line 2 via the pixel 1 and the noise Vntr transmitted to the signal line 2 via the load transistor 3 are of the opposite phase to each other. Since respective magnitudes of the noise Vnpix and the noise Vntr are represented by the same equations as used in the first embodiment, the noise Vnpix and the noise Vntr are cancelled each other in the same manner as described in the first embodiment. This can reduce an influence of noise on image quality degradation.

Figure 15:
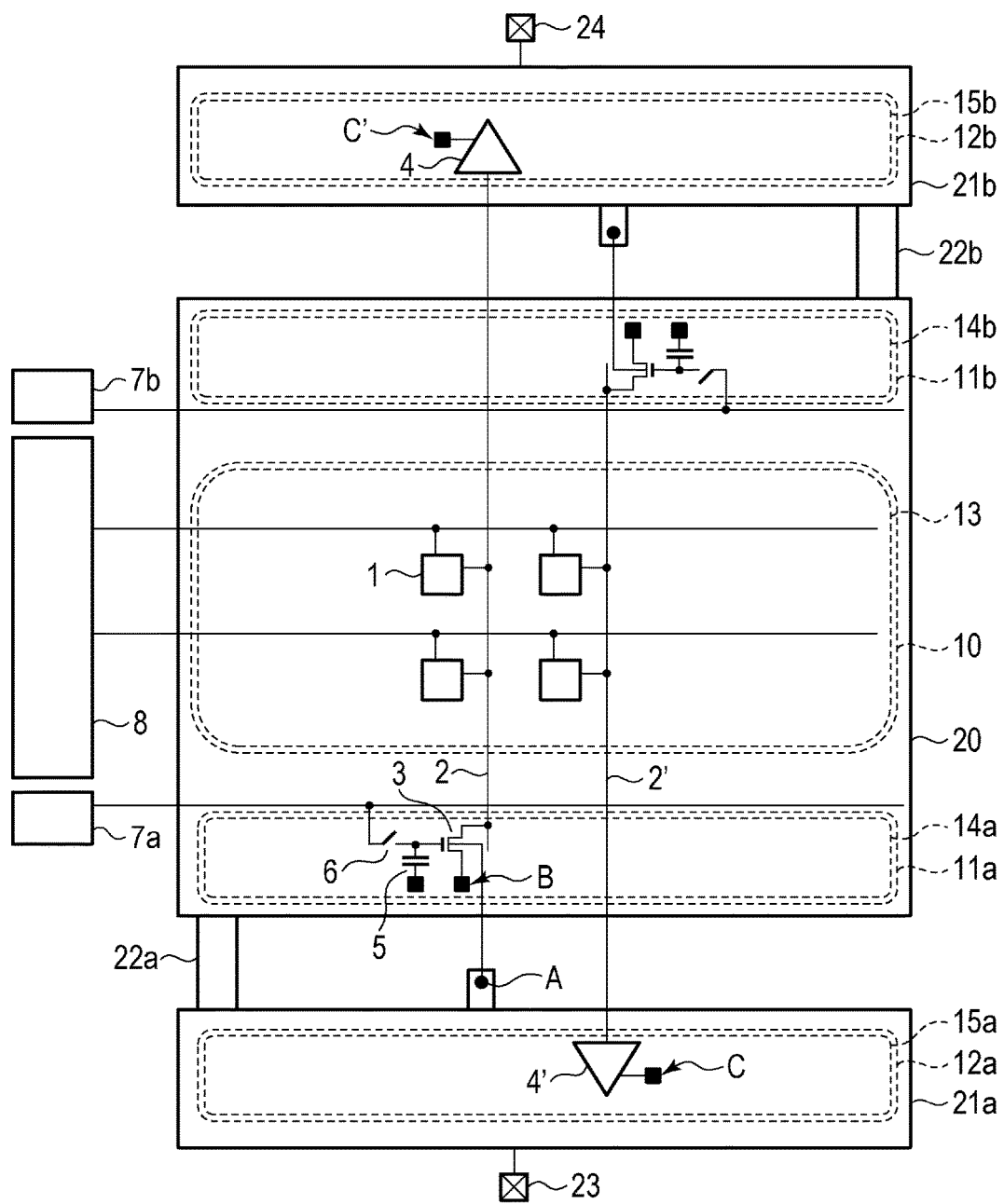
FIG. 15 is a diagram illustrating a configuration of a solid state imaging device according to a modified example of the fourth embodiment.

FIG. 15 is a diagram illustrating the configuration of a solid state imaging device according to a modified example of the fourth embodiment. In this modified embodiment, in the same manner as the third embodiment, the back-gate (the control terminal) of the load transistor 3 is connected to the ground wiring 21*a* at the point A. Also in FIG. 15, elements having the same function as described in FIG. 1 are labeled with the same reference numerals. FIG. 15 is different from FIG. 13 in that one of the terminals of the capacitor 5 which is not connected to the gate of the load transistor 3 is connected to the ground wiring 20 and the back-gate of the load transistor 3 is connected to the ground wiring 21*a* at the point A. For the same reasons as described for the third embodiment and FIG. 14, the noise Vnpix transmitted to the signal line 2 via the pixel 1 and the noise Vntr transmitted to the signal line 2 via the load transistor 3 are of the opposite phase to each other. Further, respective magnitudes of the noise Vnpix and the noise Vntr are expressed by the same equations as those in the third embodiment. Therefore, an influence of noise on image quality degradation can be reduced in the same method as described in the third embodiment.

The present embodiment may be modified to a form in which both configurations illustrated in FIG. 13 and configuration illustrated in FIG. 15 are employed together. That is, one of the terminals of the capacitor 5 which is not connected to the gate of the load transistor 3 and the back-gate of the load transistor 3 may be both connected to the ground wiring 21*a* at the point A. This results in that the noise Vntr transmitted to the signal line 2 via the load transistor 3 is a sum of a component transmitted from the gate side via the capacitor 5 and a component transmitted from the back-gate side. In this modified example, design parameters are adjusted so that at least a part of this sum and the noise Vnpix transmitted from the pixel 1 are cancelled each other.

Further, in the present embodiment, the circuit configuration may be modified such that a relay portion is provided as seen in the second embodiment and thus only a part of a voltage drop occurring on the connection portion is applied to the gate or the back-gate. Such a configuration can improve flexibility of design for the same reasons as described in the second embodiment.

In the present embodiment, there is no current flowing in a section of the signal line 2 which is located between the pixel 1 and the readout circuit 4. Therefore, the parasitic resistance of the signal line 2 does not have any influence as an output resistance of a grounded source amplification circuit that is formed of the pixel 1, the signal line 2, and the load transistor 3. Thus, in adjusting design parameters, it may be unnecessary to take the parasitic resistance of the signal line 2 into consideration.

As discussed above, even when the load transistor 3 and the readout circuit 4 are arranged in the opposite sides interposing the pixel region 10 as described in the present embodiment and the modified examples thereof, noise caused by a magnetic field fluctuation can be reduced.

Fifth Embodiment

The present embodiment is different from the first to fourth embodiments in that the connection portions 22*a* and 22*b* are not provided and the ground wiring 20 and the ground wirings 21*a* and 21*b* are separated from each other. In the present embodiment, description of the same subjects as those in the first to fourth embodiments may be simplified or omitted.

Figure 16:
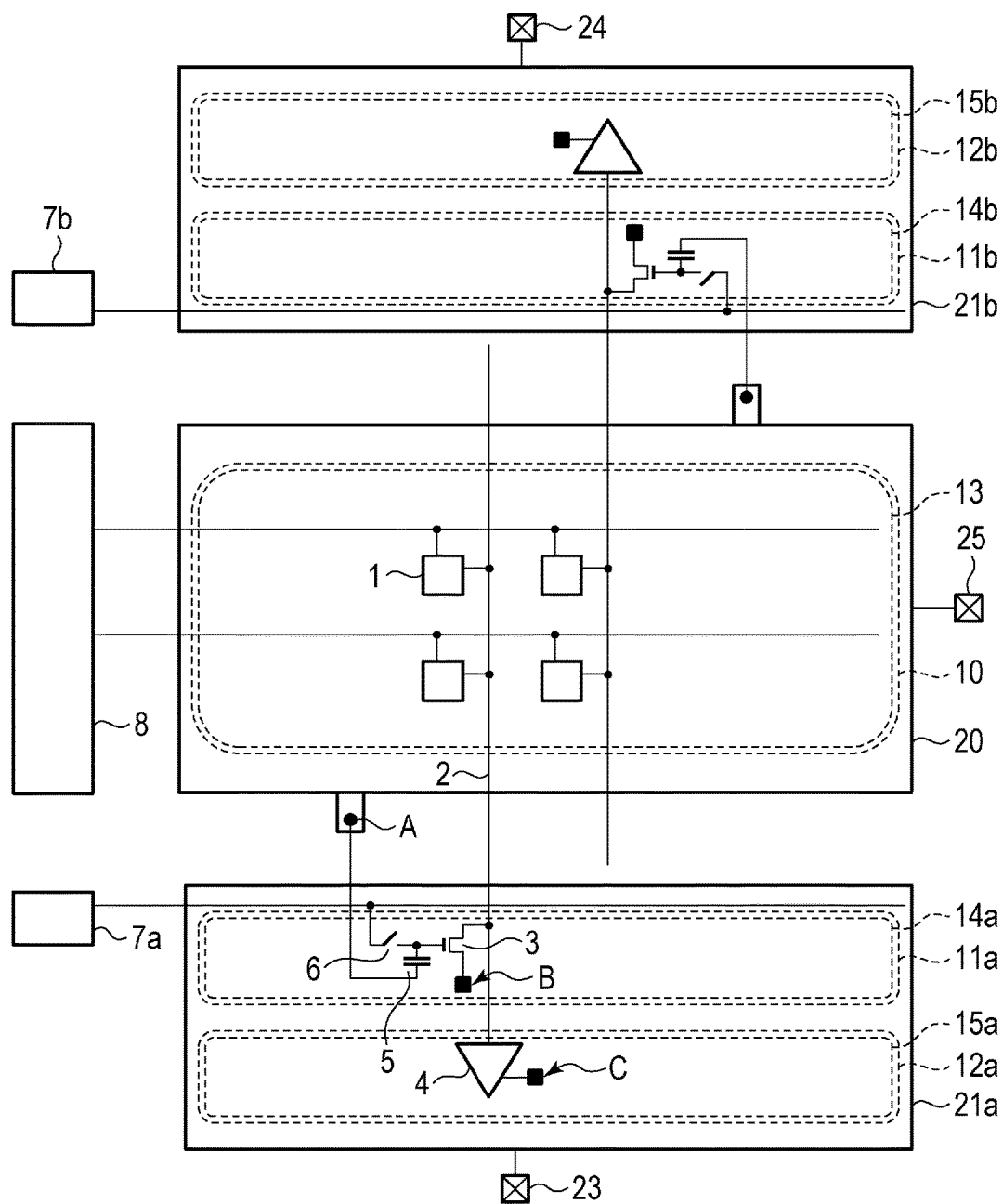
FIG. 16 is a diagram illustrating a configuration of a solid state imaging device according to a fifth embodiment.

The present embodiment will be described by using FIG. 16. Elements having the same function as described in FIG. 1 are labeled with the same reference numerals. FIG. 16 is different from FIG. 1 in that the connection portions 22*a* and 22*b* are not provided and that a pad 25 is connected to the ground wiring 20. The ground wirings 20, 21*a*, and 21*b* are separated from each other within a layer where the ground wirings are provided, and the ground wiring 20 is supplied with a ground potential via the pad 25 from the external of the solid state imaging device.

Figure 17:
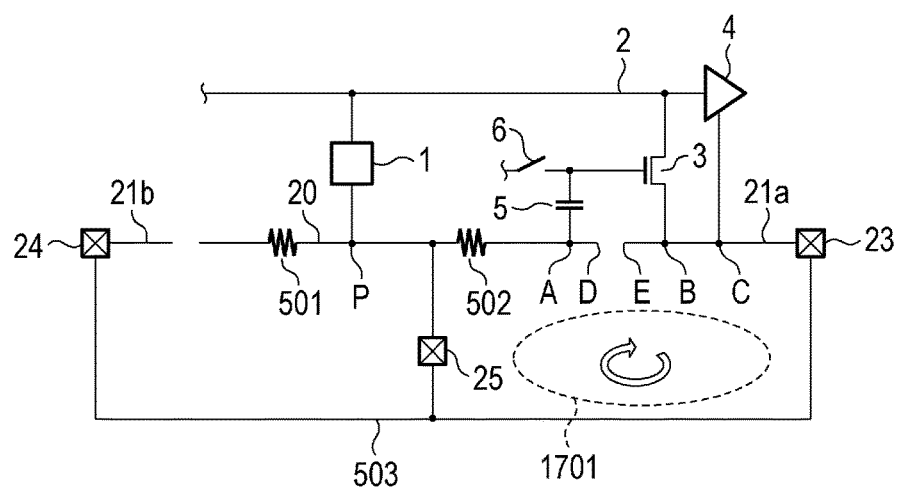
FIG. 17 is a circuit diagram of a signal line and a ground loop of the solid state imaging device according to the fifth embodiment.

FIG. 17 is a circuit diagram of a signal line and a ground loop of the solid state imaging device according to the fifth embodiment. In FIG. 17, elements having the same function as described in FIG. 5 are labeled with the same reference numerals. FIG. 17 is different from FIG. 5 in that there is no resistance corresponding to the connection portion 22 and that the pad 25 is connected to the ground wiring 20. The pad 25 is connected to the pads 23 and 24 via the external ground wiring 503. Further, facing end points of the ground wiring 20 and the ground wiring 21*a* are denoted as a point D and a point E, respectively.

With reference to FIG. 17, the advantages of the present embodiment will be described. It is assumed that a magnetic flux penetrating a loop 1701 temporarily changes and an induced electromotive force V' occurs in a direction of a depicted arrow. Since the loop 1701 is disconnected between the point D and the point E, no induced current flows. However, it can be considered that a potential difference corresponding to the induced electromotive force V' is generated between the point E and the point D. Thus, the potential of the point P is higher by the induced electromotive force V' than that of the point C. This causes the noise Vnpix=S×V' to be transmitted to the signal line 2 via the pixel 1. The potential of the point A is also higher by the induced electromotive force V' than that of the point B. This causes the noise Vntr=Gm×Rout×V' to be transmitted to the signal line 2 via the load transistor 3. Since the noise Vnpix and the noise Vntr are of the opposite phase to each other, the noises can be cancelled by designing Gm and Rout to have Vnpix=Vntr, that is, S=Gm×Rout. This allows for a reduction of an influence on image quality degradation due to noise.

Note that, when a parasitic resistance r of the signal line 2 is not ignorable, the gain of a grounded source amplification circuit that is formed of the pixel 1, the signal line 2, and the load transistor 3 is expressed by Gm=(Rout+r×x) as described in the first embodiment. Therefore, the noise Vntr transmitted to the signal line 2 via the load transistor 3 is represented by Vntr=Gm×(Rout+r×x)×V'. Thus, when the parasitic resistance r of the signal line 2 is not ignorable, a design for minimizing a sum of the noise Vntr and the noise Vnpix transmitted via the pixel 1 allows for cancellation of the noises.

Figure 18:
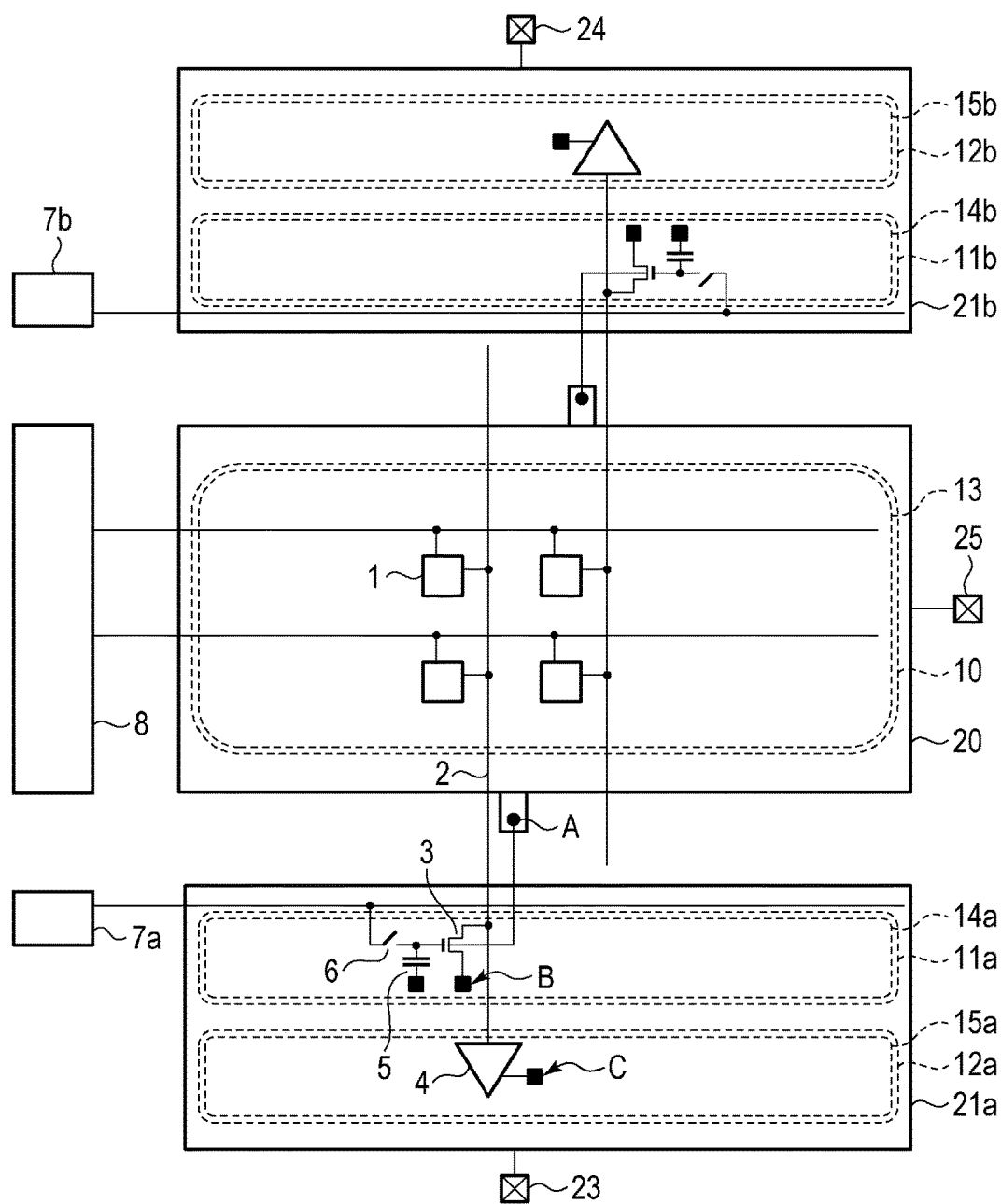
FIG. 18 is a diagram illustrating a configuration of a solid state imaging device according to a modified example of the fifth embodiment.

FIG. 18 is a diagram illustrating the configuration of a solid state imaging device according to a modified example of the present embodiment. FIG. 18 is different from FIG. 16 in that the back-gate (the control terminal) of the load transistor 3 is connected to the ground wiring 20 at the point A in the same manner as the third embodiment. That is, one of the terminals of the capacitor 5 which is not connected to the gate of the load transistor 3 is connected to the ground wiring 21a, and the back-gate of the load transistor 3 is connected to the ground wiring 20 at the point A. For the same reasons as described for the third embodiment and FIG. 17, the noise Vnpix=S×V' is transmitted to the signal line 2 via the pixel 1 and the noise Vntr=Gmb×Rout×V' is transmitted to the signal line 2 via the load transistor 3. The noise Vnpix and the noise Vntr are of the opposite phase to each other. Therefore, the noises can be cancelled by designing the Gmb and Rout to have Vnpix=Vntr, that is, S=Gmb×Rout. The same consideration as described for the configuration of FIG. 16 can be applied to the case where the parasitic resistance r of the signal line 2 is not ignorable.

The present embodiment may be modified to a form in which both configurations illustrated in FIG. 16 and configuration illustrated in FIG. 18 are employed together. In this case, the noise Vntr transmitted to the signal line 2 via the load transistor 3 is expressed by Vntr=(Gm+Gmb)×Rout×V'. Noise can be reduced by adjusting design parameters so that the noise Vntr and the noise Vnpix that is transmitted via the pixel 1 are cancelled each other.

Figure 19:
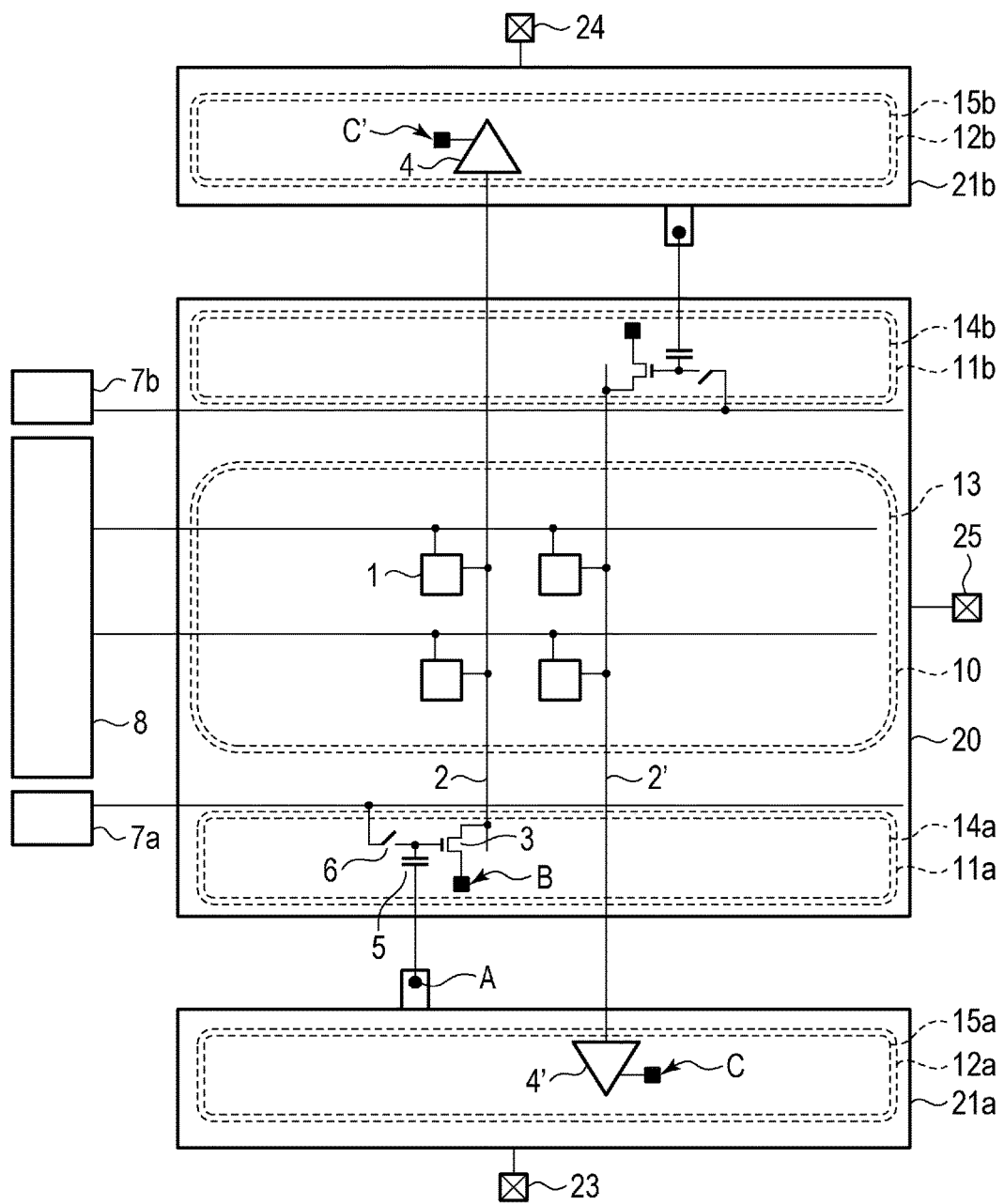
FIG. 19 is a diagram illustrating a configuration of a solid state imaging device according to a modified example of the fifth embodiment.

FIG. 19 is a diagram illustrating the configuration of a solid state imaging device according to another modified example of the present embodiment. FIG. 19 is different from FIG. 16 in that the load transistor 3 and the readout circuit 4 connected to the signal line 2 are arranged in the opposite sides interposing the pixel region 10. One of the terminals of the capacitor 5 which is not connected to the gate of the load transistor 3 is connected to the ground wiring 21a at the point A. The source of the load transistor 3 is connected to the ground wiring 20 at the point B. The ground terminal of the readout circuit 4 which is connected to the signal line 2 on the same column as the load transistor 3 is connected to the ground wiring 21b at the point C'. The readout circuit 4' is arranged in the region 12a that is in the same side as the load transistor 3 with respect to the pixel region 10. The readout circuit 4' is connected to the signal line 2' on a column different from the signal line 2. The ground terminal of the readout circuit 4' is connected to the ground wiring 21a at the point C.

Figure 20:
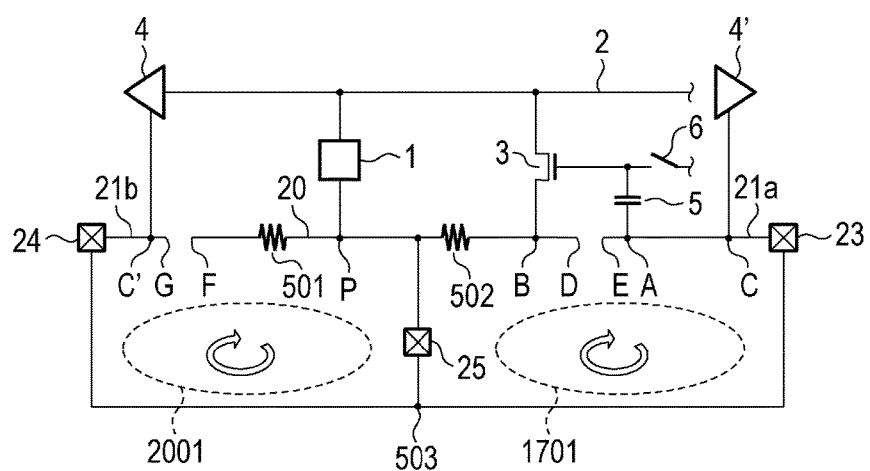
FIG. 20 is a circuit diagram of a signal line and a ground loop of the solid state imaging device according a modified example of the fifth embodiment.

FIG. 20 is a circuit diagram of a signal line and a ground loop of the solid state imaging device according to the modified example illustrated in FIG. 19. In FIG. 20, elements having the same function as described in FIG. 17 are labeled with the same reference numerals. FIG. 20 is different from FIG. 17 in that the readout circuit 4 is located in the opposite side of the load transistor 3 with respect to the pixel 1 on the signal line 2 and that the positions of the point A and the point B are exchanged on the ground loop. The facing end points of the ground wiring 20 and the ground wiring 21b are here denoted as a point F and a point G, respectively.

With reference to FIG. 20, the advantages of this modified example will be described. In this modified example, since the ground wiring 20 and the ground wiring 503 are connected by the pad 25, two loops 1701 and 2001 occur. It is assumed that magnetic fluxes penetrating the loops 1701 and 2001 temporarily change and induced electromotive forces V' and V'' occur in directions of depicted arrows, respectively. At this time, the loop 1701 is disconnected between the point D and the point E and the loop 2001 is disconnected between the point F and the point G, and thus no induced current flows. However, it is considered that potential differences corresponding to induced electromotive forces V' and V'' are generated between the point E and the point D and between the point F and the point G, respectively. Therefore, the point P has a potential that is lower by the induced electromotive force V'' than the point C'. This causes the noise Vnpix=S×V'' to be transmitted to the signal line 2 via the pixel 1. Also, the point A has a potential that is lower by the induced electromotive force V' than the point B. This causes the noise Vntr=Gm×Rout×V' to be transmitted to the signal line 2 via the load transistor 3. Since the noise Vnpix and the noise Vntr are of the opposite phase to each other, the noises can be cancelled by designing Gm and Rout to have Vnpix=Vntr, that is, S×V''=Gm×Rout×V'. This allows for a reduction in an influence of noise on image quality degradation. Here, a ratio of the magnitudes of the induced electromotive force V' to the induced electromotive force V'' is equal to a ratio of the areas of the loop 1701 to the loop 2001 if the magnetic fields penetrating the loops 1701 and 2001 can be assumed to be uniform in the entire location.

Figure 21:
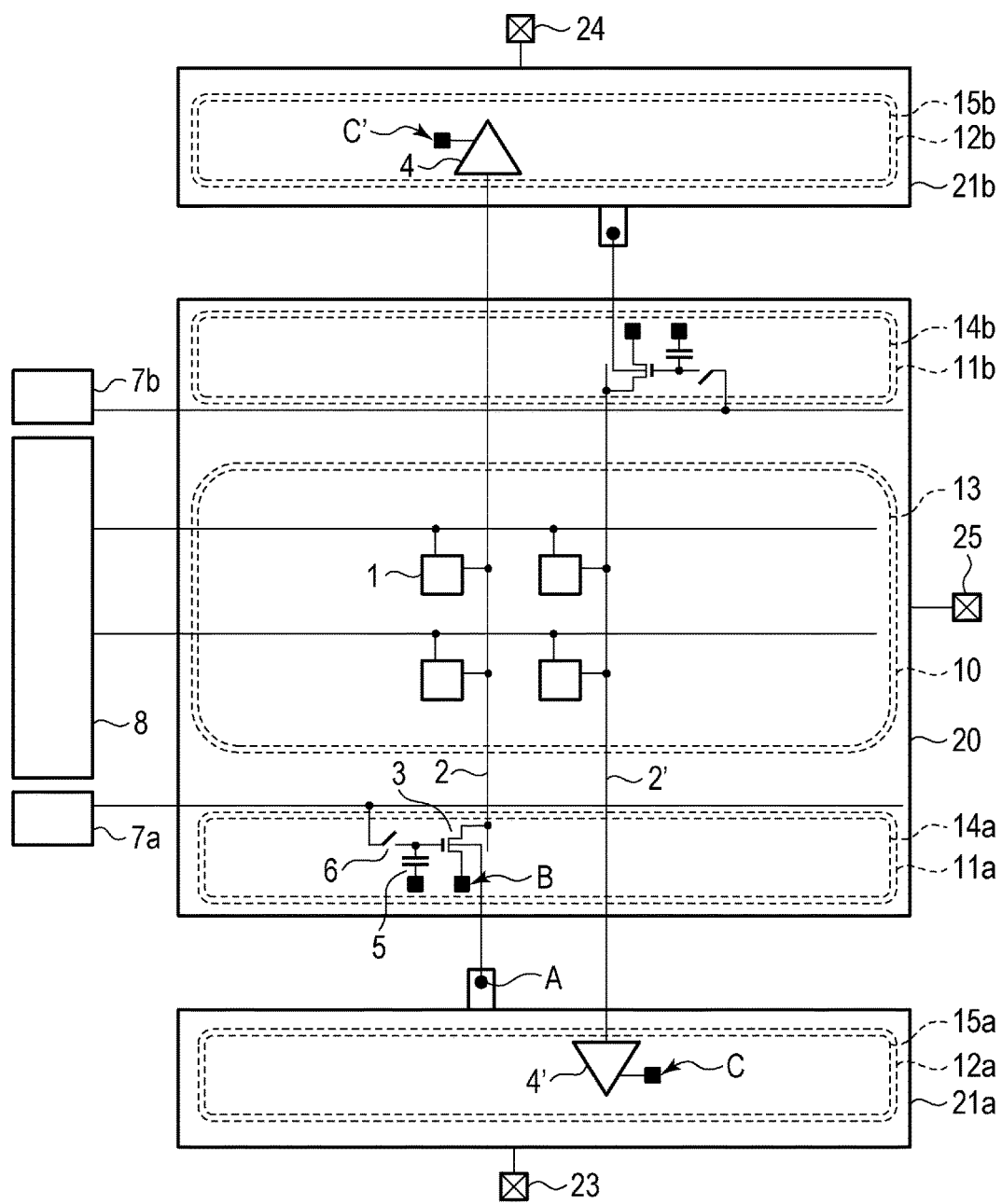
FIG. 21 is a diagram illustrating a configuration of a solid state imaging device according to a modified example of the fifth embodiment.

FIG. 21 is a diagram illustrating the configuration of a solid state imaging device according to another modified example of the present embodiment. FIG. 21 is different from FIG. 19 in that one of the terminals of the capacitor 5 which is not connected to the gate of the load transistor 3 is connected to the ground wiring 20 and the back-gate of the load transistor 3 is connected to the ground wiring 21a at the point A. For the same reasons as described for other embodiments such as the fourth embodiment and for FIG. 19, the noise Vnpix=S×V'' is transmitted to the signal line 2 via the pixel 1 and the noise Vntr=Gmb×Rout×V' is transmitted to the signal line 2 via the load transistor 3. Since Vnpix and Vntr are of the opposite phase, the noises can be cancelled by designing Gmb and Rout to have Vnpix=Vntr, that is, S×V''=Gmb×Rout×V'.

A modification may be made to employ both the configuration illustrated in FIG. 19 and the configuration illustrated in FIG. 21 together. In this case, the noise Vntr transmitted to the signal line 2 via the load transistor 3 is expressed by Vntr=(Gm+Gmb)×Rout×V'. Noise can be reduced by adjusting design parameters so as to cancel this Vntr and the noise Vnpix that is transmitted to the signal line 2 via the pixel 1.

In the configuration of FIG. 19 and FIG. 21, no current flows in the signal line 2 between the pixel 1 and the readout circuit 4. Therefore, the parasitic resistance of the signal line 2 has no influence as the output resistance of the grounded source amplification circuit that is formed of the pixel 1, the signal line 2, and the load transistor 3. Thus, it may be unnecessary to take the parasitic resistance of the signal line 2 into consideration in adjusting design parameters.

As discussed above, even when the ground wirings 20 and 21 are separated as seen in the present embodiment and the modified examples thereof, noise caused by the magnetic field fluctuation can be reduced.

Sixth Embodiment

An imaging system according to the present embodiment will be described below by using FIG. 22. FIG. is a diagram illustrating the configuration of the imaging system according to the sixth embodiment of the present embodiment. In the present embodiment, description will be provided for an example of the imaging system that applies thereto the solid state imaging device configured as illustrated in the first to fifth embodiments.

Figure 22:
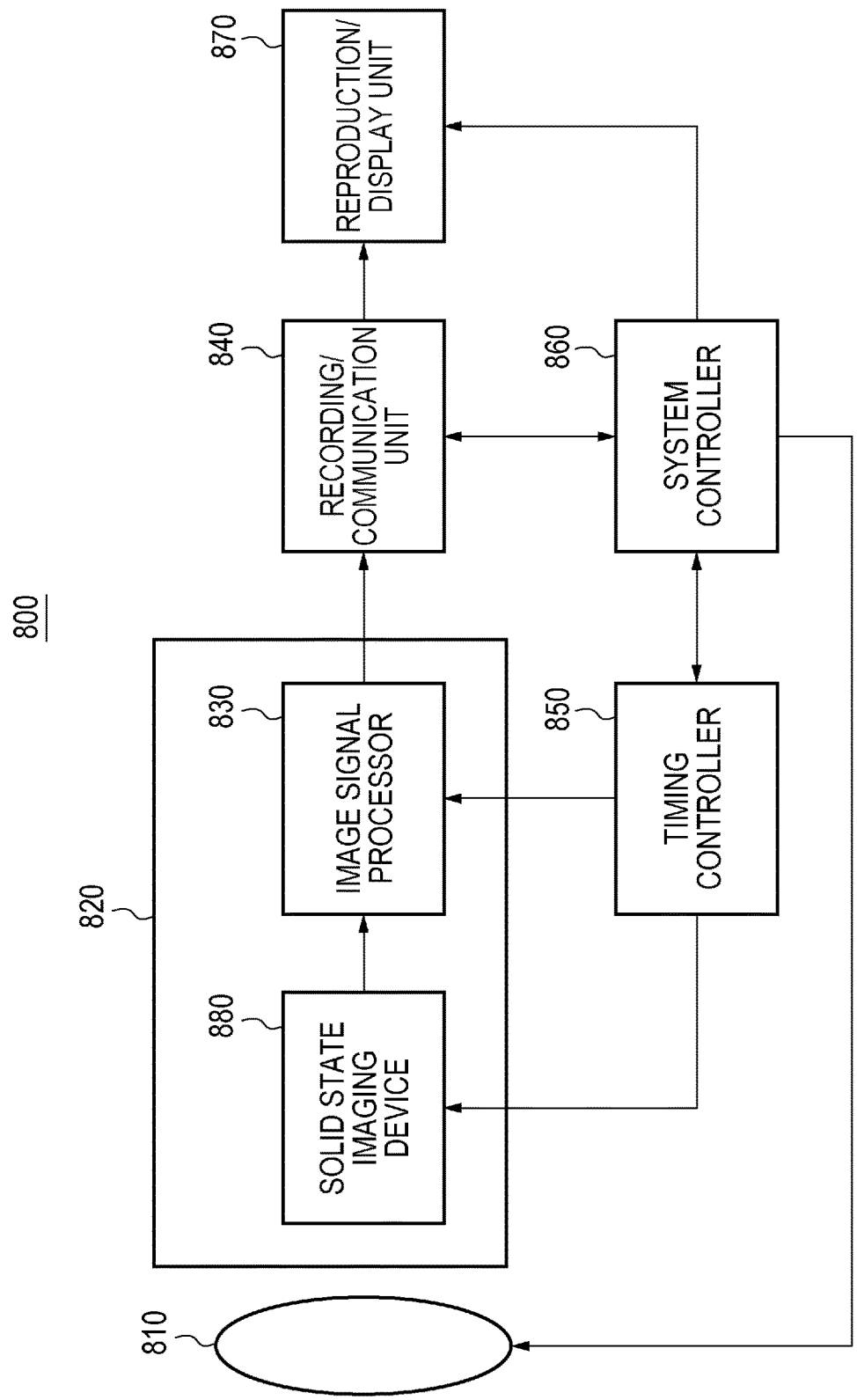
FIG. 22 is a block diagram illustrating a configuration of an imaging system according to a sixth embodiment.

An imaging system 800 illustrated in FIG. 22 has an optical unit 810, an imaging device 820, a recording/communication unit 840, a timing controller 850, a system controller 860, and a reproduction/display unit 870, for example. Here, the imaging device 820 has a solid state imaging device 880 and an image signal processer 830 (a signal processer), and the solid state imaging device described as the first to fifth embodiments is employed for the solid state imaging device 880.

The optical unit 810 that is an optical system such as a lens causes a light from an object to be captured on a pixel array in which a plurality of pixels 1 of the solid state imaging device 880 are arranged in a two-dimensional manner and forms an image of the object. The solid state imaging device 880 outputs signals in accordance with a light captured on the pixel array at a timing based on a signal from the timing controller 850. Signals output from the solid state imaging device 880 are input to the image signal processor 830, and the image signal processor 830 performs a signal processing according to a method defined by a program or the like. A signal obtained by a processing at the image signal processor 830 is transmitted to the recording/communication unit 840 as image data. The recording/communication unit 840 transmits a signal for forming an image to the reproduction/display unit 870 and causes the reproduction/display unit 870 to reproduce and display a moving image and/or a static image. Further, upon receiving a signal from the image signal processor 830, the recording/communication unit 840 communicates with the system controller 860 and, in addition, records a signal for forming an image on a recording medium (not illustrated).

The system controller 860 is to entirely control operations of the imaging system 800 and controls driving of the optical unit 810, the timing controller 850, the recording/communication unit 840, and the reproduction/display unit 870. The optical unit 810 is driven by a motor (not illustrated), for example, to perform image stabilization and/or adjustment of a focus position or the like. In the first to fifth embodiments, a source of magnetic noise that may generate an induced electromotive force on the ground wirings may be a magnetic field generated by this motor, for example.

Further, the system controller 860 includes a storage device (not illustrated) that is a recording medium, for example, and a program or the like necessary for controlling operations of the imaging system is recorded in the storage device. Further, the system controller 860 supplies a signal for switching driving modes in accordance with a user operation to the inside of the imaging system, for example. A specific example may be a change of a row to be read out and/or a row to be reset, a change of an angle of view due to electronic zooming, a shift of an angle of view due to electronic vibration isolation, or the like. The timing controller 850 controls driving timings of the solid state imaging device 880 and the image signal processor 830 based on control by the system controller 860.

According to the present embodiment, the imaging system that employs any of the solid state imaging devices described in the first to fifth embodiments is provided. In the solid state imaging devices described in the first to fifth embodiments, noise caused by a magnetic field fluctuation is reduced. Therefore, according to the present embodiment, an imaging system with less noise can be provided. Further, even when a motor for driving an optical unit is provided in the imaging system, the imaging system can be less affected by noise in the solid state imaging device caused by a magnetic field generated by the motor and thus an imaging system with less noise can be provided.

Other Embodiments

Embodiments of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiments and/or that includes one or more circuits (e.g., application specific integrated circuit (ASIC)) for performing the functions of one or more of the above-described embodiments, and by a method performed by the computer of the system or apparatus by, for example, reading out and executing the computer executable instructions from the storage medium to perform the functions of one or more of the above-described embodiments and/or controlling the one or more circuits to perform the functions of one or more of the above-described embodiments. The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-195719, filed Oct. 1, 2015, which is hereby incorporated by reference herein in its entirety.

What is claimed is:

1. A solid state imaging device comprising:
   a plurality of pixels arranged to form a plurality of columns and each configured to output a pixel signal;
   a signal line provided correspondingly to each of the plurality of columns, the pixel signal being transmitted via the signal line;
   a load transistor provided correspondingly to each of the plurality of columns and having a drain connected to the signal line;
   a readout circuit provided correspondingly to each of the plurality of columns and configured to read out the pixel signal from the signal line; and
   a control unit provided correspondingly to each of the plurality of columns and configured to control a current flowing in the load transistor in accordance with a potential of a control terminal of the control unit,
   wherein, when a reference potential of one of the plurality of pixels in a column fluctuates relatively to a reference potential of the corresponding readout circuit of the column, the potential of the control terminal of the control unit of the column relative to a potential of a source of the corresponding load transistor of the column is changed in a same phase with a fluctuation of the reference potential of the one of the plurality of pixels.

2. The solid state imaging device according to claim 1, further comprising:
   a semiconductor substrate including a first region including a first well, a second region, and a third region including a second well; and
   a reference potential wiring configured to supply the reference potential,
   wherein the plurality of pixels are arranged in the first well of the first region,
   wherein the load transistor is provided in the second region,
   wherein the readout circuit is provided in the third region,
   wherein the second region and the third region are arranged between the first region and one side of the semiconductor substrate,
   wherein the second region is arranged between the third region and the first region,
   wherein the first well is connected to the reference potential wiring via a first well contact,
   wherein the control terminal of the control unit corresponding to a first column of the plurality of columns is connected to the reference potential wiring at a connection point A,
   wherein a source of the load transistor corresponding to the first column is connected to the reference potential wiring at a connection point B,
   wherein at least a part of the readout circuit corresponding to the first column is arranged in the second well,
   wherein the second well is connected to the reference potential wiring at a connection point C via a second well contact, and
   wherein a resistance between the connection point A and the connection point B is larger than a resistance between the connection point B and the connection point C.

3. The solid state imaging device according to claim further comprising:
   a semiconductor substrate including a first region including a first well, a second region, a third region including a second well, a fourth region, and a fifth region; and
   a reference potential wiring configured to supply the reference potential,
   wherein the plurality of pixels are arranged in the first well of the first region,
   wherein the load transistor is provided in any one of the second region and the fourth region,
   wherein the readout circuit is provided in any one of the third region and the fifth region,
   wherein the control unit is provided in any one of the second region and the fourth region,
   wherein the second region and the third region are arranged between the first region and a first side of the semiconductor substrate,
   wherein the fourth region and the fifth region are arranged between the first region and a second side opposite to the first side of the semiconductor substrate,
   wherein the second region is arranged between the third region and the first region,
   wherein the fourth region is arranged between the fifth region and the first region,
   wherein the first well is connected to the reference potential wiring via a first well contact,
   wherein the control terminal of the control unit provided in the second region and corresponding to a first column of the plurality of columns is connected to the reference potential wiring at a connection point A,
   wherein a source of the load transistor provided in the second region and corresponding to the first column is connected to the reference potential wiring at a connection point B,
   wherein the readout circuit corresponding to the first column is provided in the fifth region,
   wherein the readout circuit corresponding to a second column of the plurality of columns is provided in the third region, the second column being different from the first column,
   wherein at least a part of the readout circuit in the third region is arranged in the second well,
   wherein the second well is connected to the reference potential wiring at a connection point C via a second well contact, and
   wherein a resistance between the connection point A and the connection point B is larger than a resistance between the connection point A and the connection point C.

4. The solid state imaging device according to claim 1, wherein the fluctuation of the reference potential of the plurality of pixels is due to an induced electromotive force caused by a fluctuation in a magnetic field.

5. The solid state imaging device according to claim 1, wherein the control unit controls a current flowing in the load transistor by controlling a potential of a gate of the load transistor.

6. The solid state imaging device according to claim 1, wherein the control unit controls a current flowing in the load transistor by controlling a potential of a back-gate of the load transistor.

7. The solid state imaging device according to claim 1, further comprising:
   a well in which the load transistor is formed; and
   a plurality of well contacts connected to the well,
   wherein one of the plurality of well contacts which is located closest to the load transistor corresponds to the control terminal of the control unit.

8. The solid state imaging device according to claim 1, wherein the control unit comprises:

a voltage wiring configured to supply a predetermined voltage;

a switch provided between a gate of the load transistor and the voltage wiring and configured to switch connection and disconnection between the gate of the load transistor and the voltage wiring; and a capacitor having a first terminal and a second terminal, the first terminal being connected to the gate of the load transistor, wherein the second terminal of the capacitor corresponds to the control terminal.

9. The solid state imaging device according to claim 2, wherein the plurality of pixels are arranged in the first well to form the plurality of columns, wherein the first well is connected to the reference potential wiring via a plurality of first well contacts, wherein, with respect to one of the plurality of pixels on a first column which is located closest to the load transistor corresponding to the first column, a connection point of one of the plurality of first well contacts which is the closest to the one of the plurality of pixels and the reference potential wiring is represented as a connection point H, wherein, with respect to another of the plurality of pixels on the first column which is located farthest from the load transistor corresponding to the first column, a connection point of another of the plurality of first well contacts which is the closest to the another of the plurality of pixels and the reference potential wiring is represented as a connection point J, and wherein a resistance between the connection point H and the connection point J is smaller than a resistance between the connection point C and the connection point H.

10. The solid state imaging device according to claim 2, wherein the reference potential wiring includes:

a first reference potential wiring arranged on the first region;

a second reference potential wiring arranged on the third region; and an intermediate wiring connecting the first reference potential wiring to the second reference potential wiring, wherein the intermediate wiring turns in a direction parallel to the plurality of columns or a direction intersecting the plurality of columns.

11. The solid state imaging device according to claim 2, wherein the reference potential wiring includes:

a first reference potential wiring arranged on the first region;

a second reference potential wiring arranged on the third region; and an intermediate wiring connecting the first reference potential wiring to the second reference potential wiring, wherein a length of the intermediate wiring is longer than a gap between the first reference potential wiring and the second reference potential wiring.

12. The solid state imaging device according to claim 2, wherein the reference potential wiring includes:

a first reference potential wiring arranged on the first region;

a second reference potential wiring arranged on the third region; and an intermediate wiring connecting the first reference potential wiring to the second reference potential wiring, wherein the intermediate wiring is formed containing polysilicon.

13. The solid state imaging device according to claim 2, wherein the reference potential wiring includes:

a first reference potential wiring arranged on the first region;

a second reference potential wiring arranged on the third region; and an intermediate wiring connecting the first reference potential wiring to the second reference potential wiring, wherein the intermediate wiring includes a contact that connects one layer to another, and wherein the contact is included on a path between the connection point A and the connection point B.

14. The solid state imaging device according to claim 2, wherein the reference potential wiring includes:

a first reference potential wiring arranged on the first region;

a second reference potential wiring arranged on the third region; and an intermediate wiring connecting the first reference potential wiring to the second reference potential wiring, wherein the intermediate wiring includes a semiconductor region arranged in the semiconductor substrate.

15. The solid state imaging device according to claim 2, wherein the reference potential wiring includes:

a first reference potential wiring arranged on the first region;

a second reference potential wiring arranged on the third region;

a relay portion;

a first intermediate wiring connecting the first reference potential wiring to the relay portion; and a second intermediate wiring connecting the relay portion to the second reference potential wiring, wherein the connection point A is located in the relay portion.

16. An imaging system comprising:

the solid state imaging device according to claim 1; and a signal processor that processes a signal output from the solid state imaging device.

17. The imaging system according to claim 16, further comprising:

an optical unit that causes a light from an object to be captured on the solid state imaging device; and a motor that drives the optical unit.

* * * * *